(12) United States Patent
Madurawe

(10) Patent No.: US 7,084,666 B2
(45) Date of Patent: Aug. 1, 2006

(54) PROGRAMMABLE INTERCONNECT STRUCTURES

(75) Inventor: Raminda Udaya Madurawe, Sunnyvale, CA (US)

(73) Assignee: Viciciv Technology, Sunnyvale, CA (US)

( * ) Notice: Subject to any disclaimer, the term of this patent is extended or adjusted under 35 U.S.C. 154(b) by 21 days.

(21) Appl. No.: 11/040,731

(22) Filed: Jan. 24, 2005

(65) Prior Publication Data

US 2005/0162933 A1    Jul. 28, 2005

Related U.S. Application Data

(63) Continuation-in-part of application No. 10/691,013, filed on Oct. 23, 2003.

(60) Provisional application No. 60/419,759, filed on Oct. 21, 2002.

(51) Int. Cl.
*H03K 19/173* (2006.01)

(52) U.S. Cl. .......................................... 326/38; 326/41

(58) Field of Classification Search ............ 326/38–41, 326/82, 83, 86
See application file for complete search history.

(56) References Cited

U.S. PATENT DOCUMENTS

| | | | |
|---|---|---|---|
| 4,609,986 A | 9/1986 | Hartmann et al. | |
| 4,706,216 A | 11/1987 | Carter | |
| 4,761,768 A | 8/1988 | Turner et al. | |
| 4,783,763 A | 11/1988 | Bergman | |
| 4,870,302 A | 9/1989 | Freeman | |
| 4,873,459 A | 10/1989 | El Gamal et al. | |
| 5,331,226 A * | 7/1994 | Goetting ...................... | 326/44 |
| 5,343,406 A | 8/1994 | Freeman et al. | |
| 5,455,521 A * | 10/1995 | Dobbelaere .................. | 326/17 |
| 5,488,316 A | 1/1996 | Freeman et al. | |
| 5,656,950 A * | 8/1997 | Duong et al. ................. | 326/41 |
| 5,739,713 A | 4/1998 | Sharpe-Geisler | |
| 5,835,405 A | 11/1998 | Tsui et al. | |
| 5,844,422 A | 12/1998 | Trimberger et al. | |
| 5,942,913 A * | 8/1999 | Young et al. ................. | 326/41 |
| 6,134,173 A | 10/2000 | Cliff et al. | |
| 6,137,308 A | 10/2000 | Nayak | |

(Continued)

OTHER PUBLICATIONS

Seals & Whapshott, "Programmable Logic—PLDs and FPGAs", 1997, pp. 102-117, McGraw-Hill, USA, no month.

(Continued)

*Primary Examiner*—Don Le

(57) ABSTRACT

A programmable interconnect structure in an integrated circuit comprising: a plurality of wires; and a buffer comprising an input and an output, said buffer receiving a weak signal at the input and providing a buffered signal at the output; and a first programmable multiplexer comprising: a plurality of inputs and an output, wherein the inputs are coupled to said plurality of wires, and the output is coupled to said input of the buffer; and a user configurable configuration circuit comprising a plurality of memory elements, wherein the data stored in the memory elements select one of said plurality of wires to couple to said buffer input; and a second programmable multiplexer comprising: an input and a plurality of outputs, wherein the input is coupled to said output of the buffer and the outputs are coupled to said plurality of wires; and a user configurable configuration circuit comprising a plurality of memory elements, wherein the data stored in the memory elements select said buffer output to couple to one of said plurality of wires; wherein, a signal received by the buffer on any one of the plurality of wires is buffered and transmitted to one or more of the other wires. The area of the structure is significantly reduced by increasing the number of programmable switches, generating a layout efficient wire sharing multiplexing scheme, moving the memory elements to a vertical position and using a single large area output stage in the buffer.

19 Claims, 11 Drawing Sheets

U.S. PATENT DOCUMENTS

| | | |
|---|---|---|
| 6,239,613 B1 | 5/2001 | Reddy et al. |
| 6,275,065 B1 | 8/2001 | Mendel |
| 6,331,789 B1 | 12/2001 | O-Bach |
| 6,448,808 B1 | 9/2002 | Young et al. |
| 6,515,511 B1 | 2/2003 | Sugibayashi et al. |
| 6,630,842 B1 | 10/2003 | Lewis et al. |
| 6,747,482 B1 | 6/2004 | Ting |
| 6,781,408 B1 | 8/2004 | Langhammer |
| 6,812,737 B1 | 11/2004 | Sueyoshi et al. |
| 6,828,824 B1 * | 12/2004 | Betz et al. .................. 326/47 |
| 2002/0186044 A1 | 12/2002 | Agrawal et al. |
| 2003/0085733 A1 | 5/2003 | Pugh et al. |

OTHER PUBLICATIONS

Ashok K. Sharma, "Programmable Logic Handbook—PLDs, CPLDs, & FPGAs", 1998, pp. 99-171, McGraw-Hill, USA, no month.

V. Betz, J. Rose, A. Marquardt, "Architecture and CAD for Deep-Submicron FPGAs", Feb. 1999, Kluwer Academic Publishers, Boston, no month.

Guy Lemieux, David Lewis, "Design Interconnection Networks for Programmable Logic", 2004, pp. 123-132, Kluwer Acadamic PUblishers, Boston, no month.

* cited by examiner

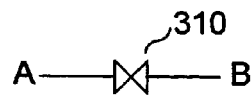
Fig-3A
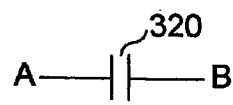
Fig-3B
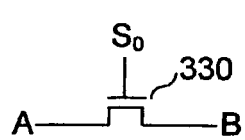
Fig-3C
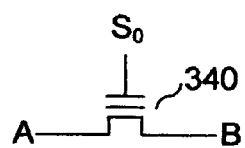
Fig-3D
Fig-3 (Related Art)
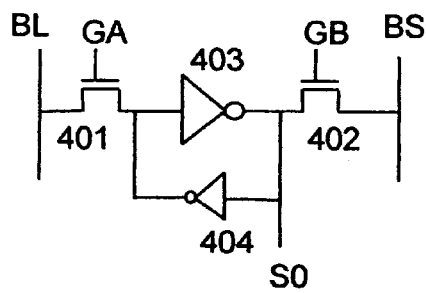
Fig-4A (Prior Art)
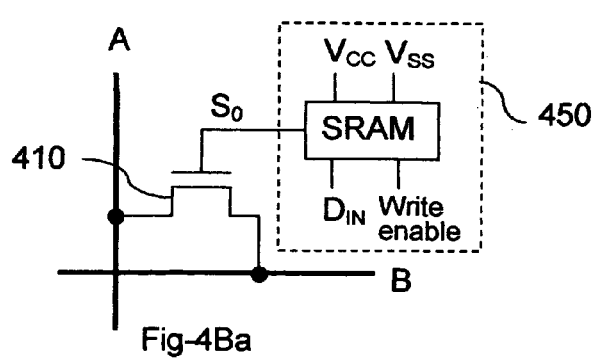
Fig-4Ba
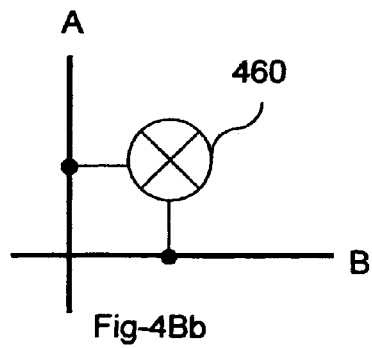
Fig-4Bb
Fig-4B (Prior Art)

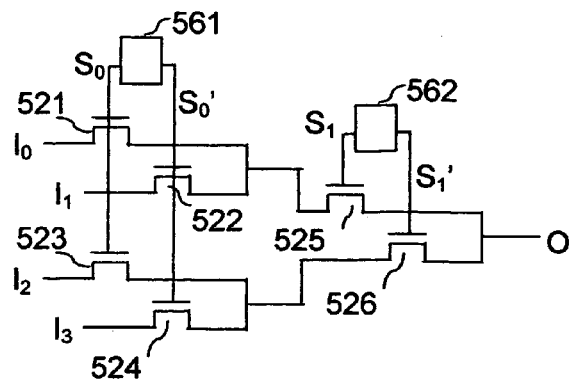
Fig-5B
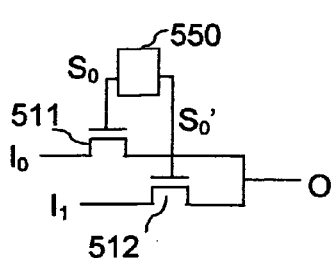
Fig-5A
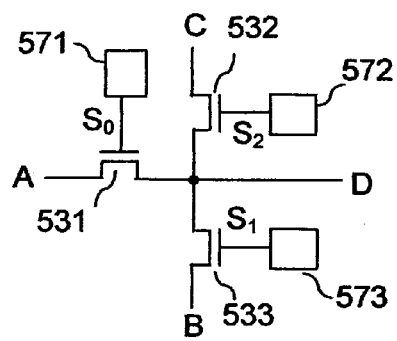
Fig-5C
Fig-5 (Prior Art)
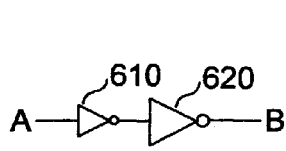
Fig-6A
(Prior Art)
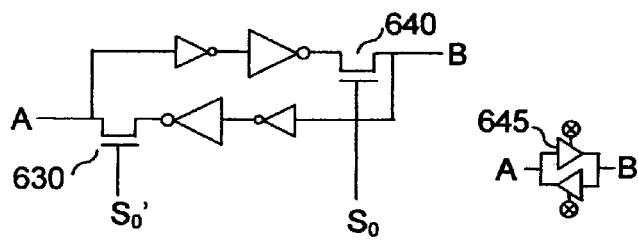
Fig-6Ba
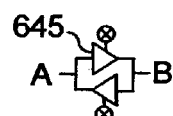
Fig-6Bb
Fig-6B (Prior Art)

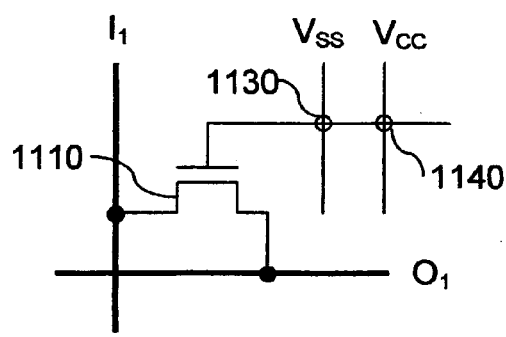
Fig-11A
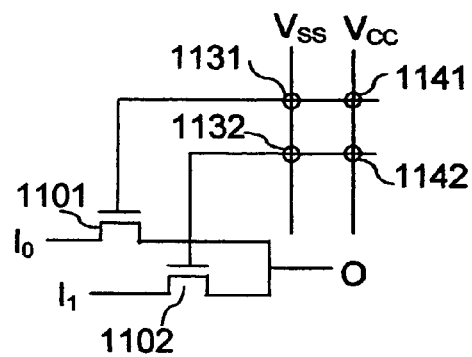
Fig-11B
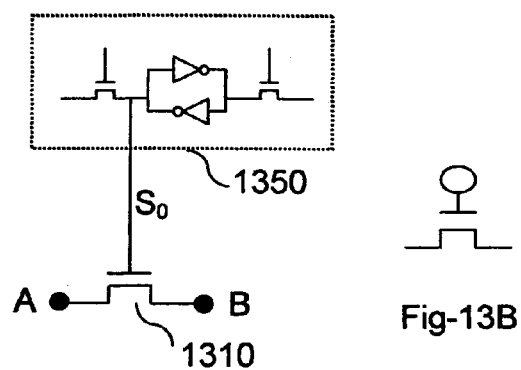
Fig-13A
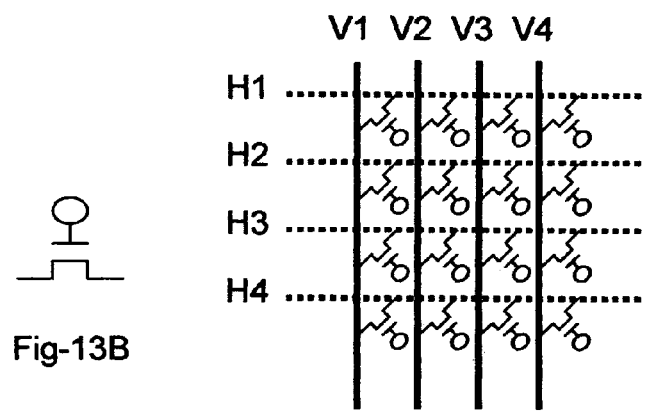
Fig-13B
Fig-13C

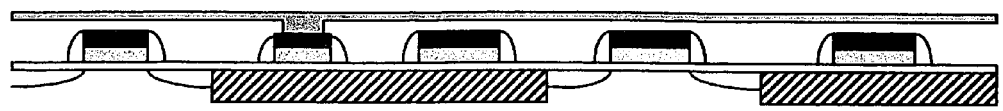
Fig - 12.1
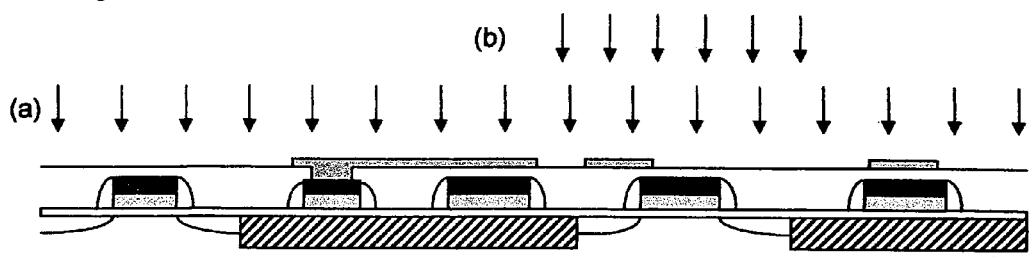
Fig - 12.2
Fig - 12.3
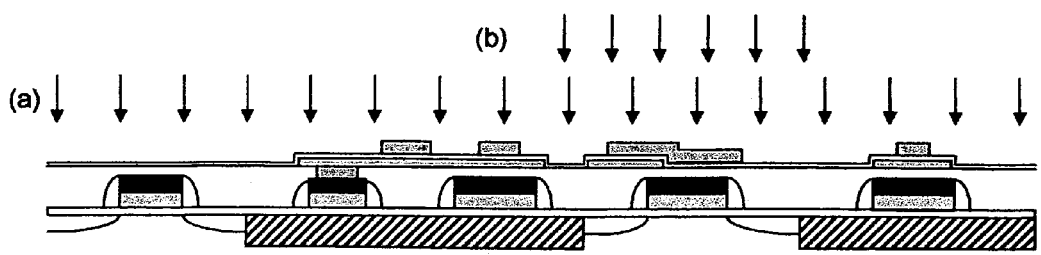
Fig - 12.4

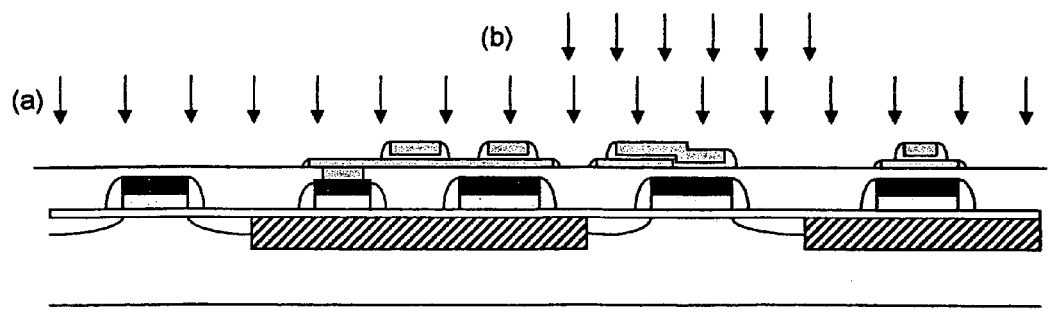
Fig - 12.5
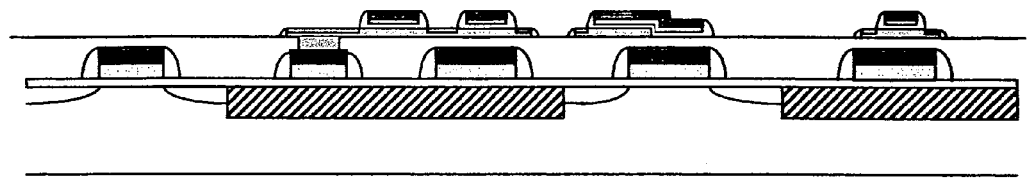
Fig - 12.6
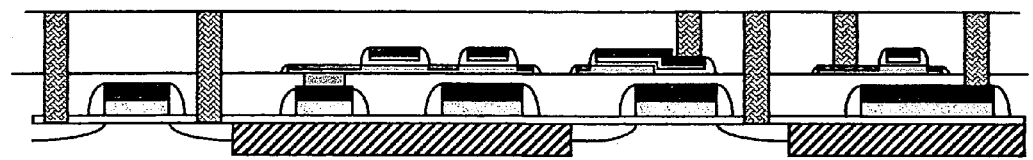
Fig - 12.7

PROGRAMMABLE INTERCONNECT STRUCTURES

This is a continuation-in-part of application Ser. No. 10/691,013 filed on Oct. 23, 2003, which claims priority from Provisional Application Ser. No. 60/419,759 filed on Oct. 21, 2002, both of which have as inventor Mr. R. U. Madurawe and the contents of which are incorporated herein by reference. This is also related to application Ser. No. 10/751,324 filed on Jan. 04, 2004 which lists as inventor Mr. R. U. Madurawe and the contents of which are incorporated herein by reference.

BACKGROUND

The present invention relates to programmable interconnect structures. Specifically it relates to area efficient bi-directional buffers used to efficiently route signals in programmable logic devices.

Traditionally, integrated circuit (IC) devices such as custom, semi-custom, or application specific integrated circuit (ASIC) devices have been used in electronic products to reduce cost, enhance performance or meet space constraints. However, the design and fabrication of custom or semi-custom ICs can be time consuming and expensive. The customization involves a lengthy design cycle during the product definition phase and high Non Recurring Engineering (NRE) costs during manufacturing phase. In the event of finding a logic error in the custom or semi-custom IC during final test phase, the design and fabrication cycle has to be repated Such lengthy correction cycles further aggravate the time to market and engineering cost. As a result, ASICs serve only specific applications and are custom built for high volume and low cost.

Another type of semi custom device called a Gate Array customizes modular blocks at a reduced NRE cost by synthesizing the design using a software model similar to the ASIC. The missing silicon level design verification results in multiple spins and lengthy design iterations. Structured ASICs come under larger module Gate Arrays.

In recent years there has been a move away from custom or semicustom ICs toward field programmable components whose function is determined not when the integrated circuit is fabricated, but by an end user "in the field" prior to use. Off the shelf, generic Programmable Logic Device (PLD) or Field Programmable Gate Array (FPGA) products greatly simplify the design cycle. These products offer user-friendly software to fit custom logic into the device through programmability, and the capability to tweak and optimize designs to improve silicon performance. The flexibility of this programmability is expensive in terms of silicon real estate, but reduces design cycle and upfront NRE cost to the designer.

FPGAs offer the advantages of low non-recurring engineering costs, fast turnaround (designs can be placed and routed on an FPGA in typically a few minutes), and low risk since designs can be easily amended late in the product design cycle. It is only for high volume production runs that there is a cost benefit in using the more traditional approaches. Compared to PLD and FPGA, an ASIC has hard-wired logic connections, identified during the chip design phase. ASIC has no multiple logic choices and no configuration memory to customize logic. This is a large chip area and cost saving for the ASIC. Smaller ASIC die sizes lead to better performance. A full custom ASIC also has customized logic functions which take less gate counts compared to PLD and FPGA configurations of the same functions. Thus, an ASIC is significantly smaller, faster, cheaper and more reliable than an equivalent gate-count PLD or FPGA. The trade-off is between time-to-market (PLD and FPGA advantage) versus low cost and better reliability (ASIC advantage). The cost of Silicon real estate for programmability provided by the PLD and FPGA compared to ASIC determines the extra cost the user has to bear for customer re-configurability of logic functions.

In a PLD and an FPGA, a complex logic design is broken down to smaller logic blocks and programmed into logic blocks provided in the FPGA. Smaller logic elements allow sequential and combinational logic design implementations. Combinational logic has no memory and outputs reflect a function solely of present inputs. Sequential logic is implemented by inserting memory into the logic path to store past history. Current PLD and FPGA architectures include transistor pairs, NAND or OR gates, multiplexers, look-up-tables (LUs) and AND-OR structures in a basic logic element. In a PLD the basic logic element is labeled as macro-cell. Hereafter the terminology FPGA will include both FPGAs and PLDs, and the terminology logic element will include both logic elements and macro-cells. Granularity of a FPGA refers to logic content of a basic logic element. Smaller blocks of a complex logic design are customized to fit into FPGA grain. In fine-grain architectures, a small basic logic element is enclosed in a routing matrix and replicated. These offer easy logic fitting at the expense of complex routing. In course-grain architectures, many basic logic elements are combined with local routing and wrapped in a routing matrix to form a logic block. The logic block is then replicated with global routing. Larger logic blocks make the logic fitting difficult and the routing easier. A challenge for FPGA architectures is to provide easy logic fitting (like fine-grain) and maintain easy routing (like course-grain).

Inputs and outputs for the Logic Element or Logic Block are selected from the programmable Routing Matrix. An exemplary routing matrix containing logic elements described in Ref-1 (Seals & Whapshott) is shown in FIG. 1. In that example, the inputs and outputs from Logic Element are routed to 22 horizontal and 12 vertical interconnect wires with programmable via connections. These connections may be anti-fuses or pass-gate transistors controlled by SRAM memory elements. The logic element having a built in fip-flop used with FIG.1 routing as described in Ref-1 is shown in FIG.2. In that, elements 201, 202 and 203 are 2:1 MUX's controlled by one input signal each. Element 204 is an OR gate while 205 is a D-Flip-Flop. Without global Preset & Clear signals, eight inputs feed the logic block, and one output leaves the logic block. These 9 wires are shown in FIG.1 with programmable connectivity. All two-input, most 2-input and some 3-input variable functions are realized in the logic block and latched to the D-Flip-Flop. FPGA architectures for various commercially available devices are discussed in Ref-1 (Seals & Whapshott) as well as Ref-2 (Sharma). A comprehensive thesis on FPGA routing architecture is provides in Ref-3 (Betz, Rose & Marquardt) and Ref-4 (Lemieux & Lewis).

Routing block wire structure defines how logic blocks are connected to each other. Neighboring logic elements have short wire connections, while die opposite corner logic blocks have long wire connections. All wires are driven by a fixed predinged logic element output buffer and the drive does not change on account of wire length. The wire delays become unpredictable as the wire lengths are randomly chosen during the Logic Optimization to best fit the design into a given FPGA. FPGA's also incur lengthy run times during timing driven optimization of partitioned logic. As FPGA's grow bigger in die size, the wire lengths increase and wire delays dominate chip performance. Wire delays grow proportional to square of the wire length, and inverse distance to neighboring wires. Chip sizes remain constant at mask dimension of about 2 cm per side, while metal wire spacing is reduced with technology scaling. A good timing optimization requires in depth knowledge of the specific FPGA fitter, the length of wires segments, and relevant process parameters; a skill not found within the design house doing the fitting. In segmented wire architectures, fixed buffers are provided to drive global signals on selected lines. These buffers are too few, too expensive, and only offer unidirectional data flow. Predictable timing is another challenge for FPGA's. This would enhance place and route tool capability in FPGA's to better fit and optimize timing critical logic designs.

FPGA architectures are discussed in U.S. Pat. Nos. 4,609,986, 4,706,216, 4,761,768, 4,783,763, 4,870,302, 4,873,459, 5,343,406, 5,488,316, 5,739,713, 5,835,405, 5,844,422, 6,134,173, 6,137,308, 6,239,613, 6,275,065, 6,331,789, 6,448,808, 6,515,511, 6,630,842, 6,747,482, 6,781,408, 6,812,737 and U.S. Publication Nos. 2002/0186044 and 2003/0085733. These patents disclose specialized routing blocks to connect logic elements in FPGA's and macro-cells in PLD's. In all cases the routing block is programmed to define inputs and outputs for the logic blocks, while the logic block performs a specific logic function.

Four methods of programmable point to point connections, synonymous with programmable switches, between A and B are shown in FIG. 3. A circuit to program the connection is not shown. All the patents listed above use one or more of these basic connections. In FIG. 3A, a conductive fuse link 310 connects A to B. It is normally connected, and passage of a high current or a laser beam will blow the conductor open. In FIG. 3B, a capacitive anti-fuse element 320 disconnects A to B. It is normally open, and passage of a high current will pop the insulator to short the terminals. Fuse and anti-fuse are both one time programmable due to the non-reversible nature of the change. In FIG. 3C, a pass-gate device 330 connects A to B. The gate signal So determines the nature of the connection, on or off. This is a non deseive change. The gate signal is generated by manipulating logic signals, or by configuration circuits that include memory. The choice of memory varies from user to user. In FIG. 3D, a floating-pass-gate device 340 connects A to B. Control gate signal $S_0$ couples a portion of that to floating gate. Electrons trapped in the floating gate determines on or off state of the connection. Hot-electrons and Fowler-Nordheim tunneling are two mechanisms to inject charge onto floating-gates. When high quality insulators encapsulate the floating gate, trapped charge stays for over 10 years. These provide non-volatile memory. EPROM, EEPROM and Flash memory employ floating-gates and are non-volatile. Anti-fuse and SRAM based architectures are widely used in commercial FPGA's, while EPROM, EEPROM, anti-fuse and fuse links are widely used in commercial PLD's. Volatile SRAM memory needs no high programming voltages, is freely available in every logic process, is compatible with standard CMOS SRAM memory, lends to process and voltage scaling and has become the de-facto choice for modem very large FPGA devices.

A volatile six transistor SRAM based configuration circuit is shown in FIG. 4A. The SRAM memory element can be any one of 6-transistor, 5-transistor, full CMOS, R-load or TFT PMOS load based cells to name a few. Two inverters 403 and 404 connected back to back forms the memory element. This memory element is a latch. The latch can be full CMOS, R-load, PMOS load or any other. Power and ground terminals for the inverters are not shown in FIG. 4A. Access NMOS transistors 401 and 402, and access wires GA, GB, BL and BS provide the means to configure the memory element. Applying zero and one on BL and BS respectively, and raising GA and GB high enables writing zero into device 401 and one into device 402. The output $S_0$ delivers a logic one. Applying one and zero on BL and BS respectively, and raising GA and GB high enables writing one into device 401 and zero into device 402. The output $S_0$ delivers a logic zero. The SRAM construction may allow applying only a zero signal at BL or BS to write data into the latch. The SRAM cell may have only one access transistor 401 or 402. The SRAM latch will hold the data state as long as power is on. When the power is turned off, the SRAM bit needs to be restored to its previous state from an outside permanent memory. In the literature for programmable logic, this second non-volatile memory is also called configuration memory. The SRAM configuration circuit in FIG. 4A controlling logic pass-gate as shown in FIG. 3C is illustrated in FIG. 4Ba Element 450 represents the configuration circuit. The $S_0$ output directly driven by the memory element in FIG. 4A drives the pass-gate gate electrode. In addition to $S_0$ output and the latch, power, ground, data in and write enable signals in 450 constitutes the SRAM configuration circuit. Write enable circuitry includes GA, GB, BL, BS signals shown in FIG. 4A. The symbol used for the programmable switch comprising the SRAM device and the pass-gate is shown in FIG. 4Bb as the cross-hatched circle 460.

A programmable MUX utilizes a plurality of point to point switches. FIG. 5 shows three different MUX based programmable logic constructions. FIG. 5A shows a programmable 2:1 MUX. In the MUX, two pass-gates 511 and 512 allow two inputs $I_0$ and $I_1$ to be connected to output O. A configuration circuit 550 having two complementary output control signals $S_0$ and $S_0'$ provides the programmability. When $S_0=1$, $S_0'=0$; $I_0$ is coupled to O. When $S_0=0$, $S_0'=1$; $I_1$ is coupled to O. With one memory element inside 550, one input is always coupled to the output. If two bits were provided inside 550, two mutually exclusive outputs $S_0$ and $S_1$ could be generated. That would allow neither $I_0$ nor $I_1$ to be coupled to O, if such a requirement exists in the logic design. FIG. 5B shows a programmable 4:1 MUX controlled by 2 memory elements. A similar construction when the 4 inputs $I_0$ to $I_3$ are replaced by 4 memory element outputs $S_0$ to $S_3$, and the pass-gates are controlled by two inputs $I_0$ & $I_1$ is called a 4-input look up table (LUT). The 4:1 MUX in FIG. 5B operate with two memory elements 561 and 562 contained in the configuration circuit 560 (not shown). Similar to FIG. 5A, one of $I_0$, $I_1$, $I_2$ or $I_3$ is connected to O depending on the $S_0$ and $S_1$ states. For example, when $S_0=1$, $S_1=1$, $I_0$ is coupled to O. Similarly, when $S_0=0$ and $S_1=0$, $I_3$ is coupled to O. A 3 bit programmable 3:1 MUX is shown in FIG. 5C. Point D can be connected to A, B or C via pass-gates 531, 533 or 532 respectively. Memory elements 571, 573 and 572 contained in a configuration circuit 570 (not shown) control these pass-gate input signals. Three memory elements are required to connect D to just one, any two or all three points.

FPGA and ASICs require buffers to improve signal propagation delay in long wires. This is shown in FIG. 6A, where the incoming signal at point A in the wire is buffered by inverter 610 and 620 in series. The two inverters are sized appropriately to drive a long segment of wire starting at B node of the wire. The buffer may drive more than one wire. A programmable bi-directional buffer from U.S. Pat. No.

4,870,302 shown in FIG. 6Ba has two such back-to-back buffers gated by two pass-gate logic elements 630 and 640. Unlike the full CMOS signal drive at point B in FIG. 6A, the buffers in FIG. 6Ba has many draw backs: (i) the area requirement for two back to back buffers, (ii) threshold voltage (Vt) drop in passing voltage power (Vcc) level, (iii) boosted pass-gate signal level over Vcc if not to lose Vt drop, (iv) larger area CMOS pass-gate if not to lose Vt drop, (v) pass-gate ON resistance impacting signal delay and (vi) very wide width of pass-gate (hence large area) to minimize ON resistance. The symbol used in this disclosure for the dual buffer structure in FIG. 6Ba is shown in FIG. 6Bb, wherein two back to back elements 645 are shown. Each element 645 represents the buffer and the pass-gate controlled by the SRAM device show in FIG. 6Ba Either a single SRAM bit or two SRAM bits may be used in FIG. 6Bb to control the two buffers. With one bit control, as show in FIG. 6Ba, one of the paths in the buffer is always activated. With two SRAM bit controls, both buffers can be de-activated to tri-state the wires. The two buffers consume a very large Si area due to the very wide width of the transistors needed to drive data quickly. Often times, unidirectional wires with single buffers are provided in FPGAs (that have hundreds of thousands of wires) to reduce the cost associated with adding dual buffers on every wire. That restriction is counter productive for the software tools that provide routing for randomly placed logic blocks, as each wire has a pre-defined direction for data flow, and routing choices are restricted. An inexpensive programmable buffer to eliminate these draw backs is highly desirable for FPGA's. None of the prior teachings demonstrate how to implement programmable buffers to overcome these deficiencies.

A useful measure of a programmable circuit is the gate comparison to an equivalent application specific circuit. SRAM based programmable pass-gates have to absorb the transistor overhead in the SRAM memory element. This can be easily seen in a 4 point switch in FIG. 6C discussed in Ref-3 (Betz, Rose & Marquardt) and U.S. Pat. No. 4,870, 302. The switch in FIG. 6C is a simple extension of the 3:1 MUX for 4 points. An ASIC will connect two points with a direct connection inside the circle. This programmable alternative has 6 wide pass-gate devices (such as 652) and 6 SRAM devices (such as 651). The SRAM (similar to FIG. 4A) overhead is 36 transistors, while the pass-gate overhead is 6 transistors. Such an overhead is extremely uneconomical for modern FPGA's that require some level of reasonable cost parity to an ASIC. In most programmable devices, after the user has finalized the logic design, it is rarely or never changed. For such designs, a conversion from programmable to application specific is highly desirable. The referenced usages do not lend to an easy economical conversion.

FPGAs are comprised of bundles of wires spanning in X and Y directions of the FPGA device, each bundle connecting pre-arranged programmable logic blocks. The wires are often times segmented to be of a certain length. At the termination points on either end, each wire is provided with a Bridge connection, such as in FIG. 6C, to connect the wire to a plurality of choices. Most times the signals have to be buffered at these junctions. An integration of the buffer structure shown in FIG. 6B with the bridge in FIG. 6C is shown in FIG. 6D. There are 12 buffers, 12 pass-gate devices, and 12 SRAM bits to make this circular bi-directional buffered bridge connection, which is astronomical on Si real estate. In the bridge in FIG. 6D, if there are N-ports, there are ($N^2$-N) buffers needed to construct the full bridge, which is a quadratic relationship. Many such buffered Bridge connections are discussed by Lemieux (Ref-4, pages 123–124), and the attempt is to reduce the components necessary to build an efficient Bridge. A second embodiment of a Bridge is shown in FIG. 6E (Lemieux, Ref-4, page-124, FIG. 6.17e), which comprises 4 buffers, 14 pass gates and 14 SRAM bits. With FIG. 4E, if there are N-ports in the bridge, only N buffers are needed. Here the trade off is to reduce the number of buffers, at the expense of adding pass-gates and SRAM bits. The most effective solution has the least Si area consumption and the best signal transit delay through the bridge.

What is desirable is to have an inexpensive, fast and timing predictable routing block to connect logic elements. These routing connections need to facilitate short wire connections and long wire connections and then preserve timing in a predictable and calculable manner. It is also beneficial to have the ability to program the data flow direction, and have this configurability integrated into configuration circuits. When long wires are used, repeaters are inserted along wire segments to re-generate the signal integrity and improve signal delay. It is extremely cost ineffective to use two back-to-back buffers to provide bi-directional data flow. A technique to use a single bi-directional buffer would save a very large Si area and cost for programmable devices that use hundreds of thousands of wires. Much more efficient bridges that consume less Si real estate is needed for FPGAs. Furthermore, the drawbacks discussed earlier for bi-directional wires must be eliminated to improve fitting. Such a routing block should have reasonable cost parity to ASICs and also lend to an easy application specific design conversion to the user, preserving the original timing characteristics of the circuit during the conversion.

SUMMARY

In one aspect, a programmable interconnect structure for an integrated circuit comprises: a pass-gate fabricated on a substrate layer to electrically connect a first node to a second node; and a configuration circuit including at least one memory element to control said pass-gate fabricated substantially above said substrate layer; and a programmable method to select between isolating said first and second nodes and connecting said first and second nodes.

Implementations of the above aspect may include one or more of the following. An interconnect structure is a switch. Most common device is a pass-gate. A pass-gate is an NMOS transistor, a PMOS transistor or a CMOS transistor pair that can electrically connects two points. Other methods of connecting two points include fuse links and anti-false capacitors. The gate electrode signal on these pass-gates allows a programmable method of controlling an on and off connection. A plurality of pass-gate logic is included in a programmable logic device. The logic device comprises circuits consisting of CMOS transistors that include AND, NAND, OR, NOR and pass-gate type logic structures. Multiple logic circuits are combined into larger logic blocks. Configuration circuits are used to change programmable logic functionality. Configuration circuits have memory elements and access circuitry to change memory data. Each memory element can be a transistor or a diode or a group of electronic devices. The memory elements can be made of CMOS devices, capacitors, diodes on a substrate. The memory elements can be made of thin film devices such as thin film transistors (TFT), capacitors and diodes. The memory element can be selected from the group consisting of volatile and non volatile memory elements. The memory element can also be selected from the group of fuses, antifuses, SRAM cells, DRAM cells, optical cells, metal optional links, EPROMs, EEPROMs, flash, magnetic and ferro-electric elements. One or more redundant memory elements can be provided for controlling the same circuit block. The memory element can generate an output signal to control logic gates. Memory element can generate a signal that is used to derive a control signal. The control signal is coupled to pass-gate logic element, AND array, NOR array, a MUX or a Look-Up-Table (LUT) logic. Configuration circuits take a large Silicon foot print. This adds to the cost of programmable logic compared to a similar functionality application specific device. Reducing configuration circuit Silicon usage helps reduce programmable logic cost. A 3-dimensional integration of configuration circuits provides such a cost reduction Logic circuits are fabricated using a basic logic process capable of making CMOS transistors. The pass-gates are formed on P-type, N-type, epi or SOI substrate wafers. The configuration circuits may be formed above the logic transistors. This may be achieved by inserting a thin-film transistor (TFT) module at contact layer of the logic process. The thin-film transistor outputs may be directly coupled to gate electrodes of pass-gates on substrate to provide logic control. Buried contacts may be used to make these connections. The contacts may be filled with doped poly-silicon, Titanium-Tungsten, Tungsten Silicide, or some other refractory metal. Memory elements may be constructed also with TFT transistors, capacitors and diodes. The TFF layers may be restricted for only configuration circuits, not used for logic signal lines. Metal layers above the TFT layers may be used for all the routing for the storage device, and configuration device. All signal paths may utilize wires and storage circuitry with no impact from TFT layers used for configuration circuits. This simple pass-gate switch with a vertically integrated configuration circuit reduces programmable logic cost.

In a second aspect, a programmable interconnect structure in an integrated circuit comprising: a first wire and a second wire; and a buffer comprising an input and an output, said buffer receiving a weak signal at the input and providing a buffered signal at the output; and a first programmable multiplexer comprising: two inputs and an output, wherein the inputs are coupled to said first and second wires, and the output is coupled to said input of the buffer, and a user configurable configuration circuit comprising a memory element, wherein the data stored in the memory element selects one of said two wires to couple to said buffer input; and a second programmable multiplexer comprising: an input and two outputs, wherein the input is coupled to said output of the buffer and the outputs are coupled to said first and second wires; and a user configurable configuration circuit comprising a memory element, wherein the data stored in the memory element selects said buffer output to couple to one of said two wires; wherein, a signal received by the buffer on any one of the two wires is buffered and transmitted on the other wire.

Implementations of the above aspect may include one or more of the following A buffer is a circuit to amplify a signal. A simple buffer is one large inverter. A simple buffer is two or more inverters in series, sized sequentially larger to generate a high drive current Buffer output polarity can be the same or opposite of that at input. Odd and even number of stages determine the polarity. A buffer is used to transmit signals in long wires, or wires comprising a high capacitive load. A wire carries data in one direction, from a source to a sink node. A programmable wire allows the direction of data flow to be chosen by the user. A programmable buffer allows bi-directional data flow to facilitate long wire connections in programmable logic. The last stage of the buffer consumes a large Silicon area. An economical bi-directional wire structure provides a single buffer to receive and transmit signals in either direction. Application specific logic also utilizes buffers to amplify signals. A 3-intentionally integrated programmable buffer allows a technique to reach within 2× area of an application specific buffer. Existing FPGA techniques utilizing a 6 pass-gate Bridge with 42 transistors to replace a single via in an application specific device is simply not economical for future FPGA designs.

In a third aspect, a programmable interconnect structure (a bridge) in an integrated circuit comprising: a plurality of wires; and a buffer comprising an input and an output, said buffer receiving a weak signal at the input and providing a buffered signal at the output; and a first programmable multiplexer comprising: a plurality of inputs and an output, wherein the inputs are coupled to said plurality of wires, and the output is coupled to said input of the buffer; and a user configurable configuration circuit comprising a plurality of memory elements, wherein the data stored in the memory elements select one of said plurality of wires to couple to said buffer input; and a second programmable multiplexer comprising: an input and a plurality of outputs, wherein the input is coupled to said output of the buffer and the outputs are coupled to said plurality of wires; and a user configurable configuration circuit comprising a plurality of memory elements, wherein the data stored in the memory elements select said buffer output to couple to one of said plurality of wires; wherein, a signal received by the buffer on any one of the plurality of wires is buffered and transmitted to one or more of the other wires.

Implementations of the above aspect may further include one or more of the following. A buffered bridge uses a single buffer to reduce the Si area cost. A bridge provides economical routing between a set of pre-defined wires. A bridge has memory elements constructed substantially above the wires to reduce Si area and cost. The memory element can be selected from the group consisting of volatile or non volatile memory elements. The memory can be implemented using a TFT process technology that contains one or more of Fuses, Anti-fuses, DRAM, EPROM, EEPROM, Flash, Ferro-Electric, optical, magnetic and SRAM elements. Configuration circuits may include thin film elements such as diodes, transistors, resistors and capacitor. The process implementation is possible with any memory technology where the programmable element is vertically integrated in a removable module. The configuration circuit includes a predetermined conductive pattern in lieu of memory elements to control the programmable logic in the storage circuits. Multiple memory bits exist to customize logic functions. Each memory bit pattern has a corresponding unique conductive pattern to duplicate the same customized logic function. Circuit performance of the logic function is not affected by the choice of logic control: memory elements or conductive pattern.

Implementations of the above aspects may include one or more of the following. A routing structure may comprise a plurality of bridges, each coupling a set of wires. Multiple bundles of wires terminating at a switching point may have multiple bridges assigning programmable routing patterns. Such an interconnect device constitutes fabricating a VLSI IC product. The IC product is re-programmable in its initial stage with turnkey conversion to an ASIC. The IC has the end ASIC cost structure and FPGA re-programmability. The IC product offering occurs in two phases: the first stage is a generic FPGA that has re-programmability containing a programmable module, and the second stage is an ASIC with the entire programmable module replaced by 1 to 2 customized hard-wire masks.

A series product families can be provided with a modularized programmable element in an FPGA version followed by a turnkey custom ASIC with the same base die with 1–2 custom masks. The vertically integrated programmable module does not consume valuable silicon real estate of a base die. Furthermore, the design and layout of these product families adhere to removable module concept: ensuring the functionality and timing of the product in its FPGA and ASIC canonicals. These IC products can replace existing PLD and FPGA products and compete with existing Gate Arrays and ASIC's in cost and performance.

An easy turnkey customization of an ASIC from an original smaller cheaper and faster PLD or FPGA would greatly enhance time to market, performance, and product reliability.

BRIEF DESCRIPTION OF THE DRAWINGS

FIG. 3A shows an exemplary fuse link point to point connection.

FIG. 3B shows an exemplary anti-fuse point to point connection.

FIG. 3C shows an exemplary pass-gate point to point connection.

FIG. 3D shows an exemplary floating-pass-gate point to point connection.

FIG. 4A shows an exemplary configuration circuit for a 6T SRAM element.

FIG. 4Ba shows an exemplary programmable pass-gate switch with SRAM memory.

FIG. 4Bb shows the symbol used for switch in FIG. 4Ba.

FIG. 5A shows an exemplary 2:1 MUX controlled by one bit.

FIG. 5B shows an exemplary 4:1 MUX controlled by 2 bits.

FIG. 5C shows an exemplary 3:1 MUX controlled by 3 bits.

FIG. 6A shows an exemplary CMOS buffer comprising two inverters.

FIG. 6Ba shows an exemplary programmable bi-directional buffer.

FIG. 6Bb shows the symbol used for the bi-directional buffer on FIG. 6Ba.

FIG. 11A shows a hard-wire mapping for a programmable pass-gate.

FIG. 11B shows a hard-wire mapping for a programmable 2:1 MUX

FIG. 12 shows constructional process cross sections of a TFT process.

FIG. 13A shows a programmable pass-gate with TFT SRAM memory element.

FIG. 13B shows the symbol for a TFT memory based programmable pass-gate.

FIG. 13C shows a 4×4 array of TFT memory based programmable pass-gate matrix.

DESCRIPTION

Figure 1:
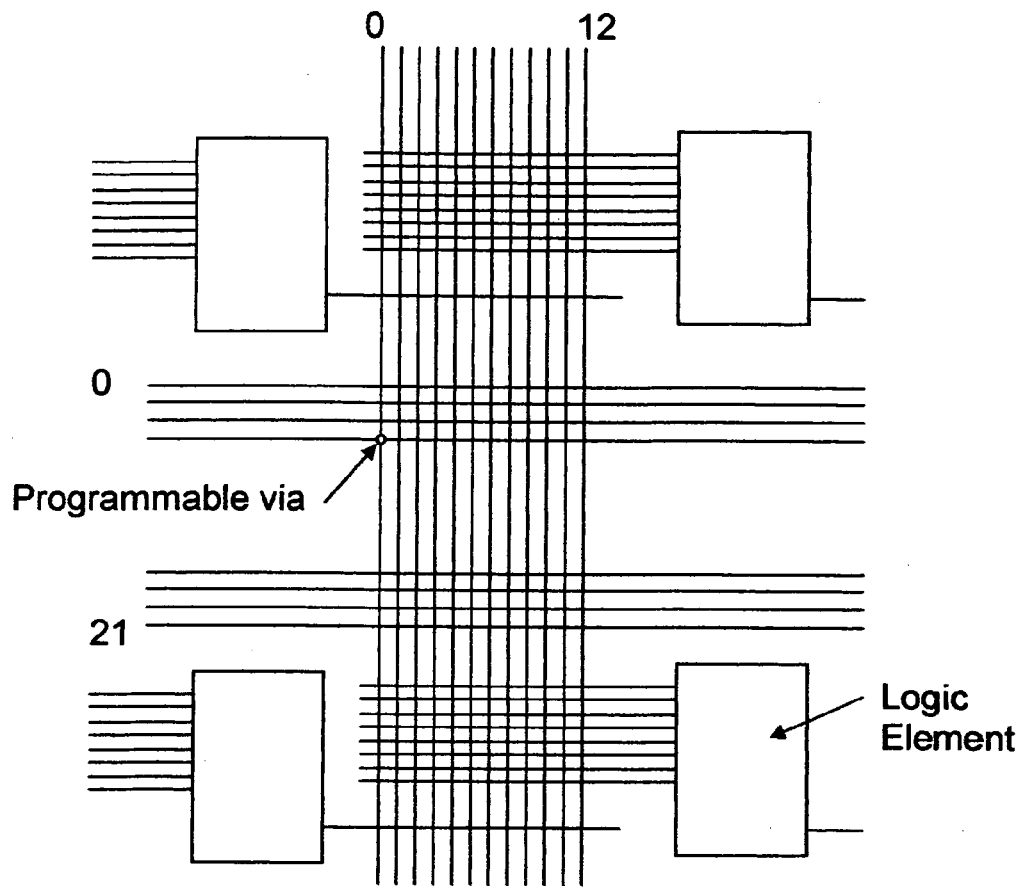
FIG. 1 shows an exemplary interconnect structure utilizing a logic element.
Figure 2:
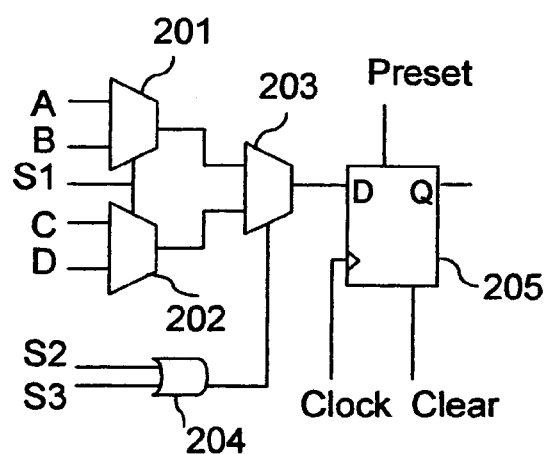
FIG. 2 shows an exemplary logic element.

In the following detailed description of the invention, reference is made to the accompanying drawings which form a part hereof, and in which is shown, by way of illustration, specific embodiments in which the invention may be practiced. These embodiments are described in sufficient detail to enable those skilled in the art to practice the invention. Other embodiments may be utilized and structural, logical, and electrical changes may be made without departing from the scope of the present invention.

Definitions: The terms wafer and substrate used in the following description include any structure having an exposed surface with which to form the integrated circuit (IC) structure of the invention. The term substrate is understood to include semiconductor wafers. The term substrate is also used to refer to semiconductor structures during processing, and may include other layers that have been fabricated thereupon. Both wafer and substrate include doped and undoped semiconductors, epitaxial semiconductor layers supported by a base semiconductor or insulator, SOI material as well as other semiconductor structures well known to one skilled in the art. The term conductor is understood to include semiconductors, and the term insulator is defined to include any material that is less electrically conductive than the materials referred to as conductors.

The term module layer includes a structure that is fabricated using a series of predetermined process steps. The boundary of the structure is defined by a first step, one or more intermediate steps, and a final step. The resulting structure is formed on a substrate.

The term pass-gate refers to a structure that can pass a signal when on, and blocks signal passage when off. A pass-gate connects two points when on, and disconnects two points when off. A pass-gate can be a floating-gate transistor, an NMOS transistor, a PMOS transistor or a CMOS transistor pair. The gate electrode of pass-gate determines the state of the connection. A CMOS pass-gate requires complementary signals coupled to NMOS and PMOS gate electrodes. A control logic signal is connected to gate electrode of a pass-gate for programmable logic.

The term buffer includes a structure that receives a weak incoming signal and transmits a strong output signal. Buffers provide high drive current to maintain signal integrity. Buffer includes repeaters that rejuvenate signal integrity in long wires. Buffer further includes a single inverter, and a series of connected inverters wherein each inverter in the series is sized larger to provide a higher drive current.

The term bridge includes a structure that manages routing within a set or a cluster of wires. Signals arriving at the bridge on a wire may be transmitted to one or more other wires in that bridge. A bridge includes simple transmission, buffered transmission, uni-directional or multi-directional routing on the wire cluster. A bridge includes switch blocks.

The term configuration circuit includes one or more configurable elements and connections that can be programmed for controlling one or more circuit blocks in accordance with a predetermined user-desired functionality. The configuration circuit includes the memory element and the access circuitry, herewith called memory circuitry, to modify said memory element. Configuration circuit does not include the logic pass-gate controlled by said memory element. In one embodiment, the configuration circuit includes a plurality of memory circuits to store instructions to configure an FPGA. In another embodiment, the configuration circuit includes a first selectable configuration where a plurality of memory circuits is formed to store instructions to control one or more circuit blocks. The configuration circuits include a second selectable configuration with a predetermined conductive pattern formed in lieu of the memory circuit to control substantially the same circuit blocks. The memory circuit includes elements such as diode, transistor, resistor, capacitor, metal link, among others. The memory circuit also includes thin film elements. In yet another embodiment, the configuration circuits include a predetermined conductive pattern, via, resistor, capacitor or other suitable circuits formed in lieu of the memory circuit to control substantially the same circuit blocks.

The term "horizontal" as used in this application is defined as a plane parallel to the conventional plane or surface of a wafer or substrate, regardless of the orientation of the wafer or substrate. The term "vertical" refers to a direction perpendicular to the horizontal direction as defined above. Prepositions, such as "on", "side", "higher", "lower", "over" and "under" are defined with respect to the conventional plane or surface being on the top surface of the wafer or substrate, regardless of the orientation of the wafer or substrate. The following detailed description is, therefore, not to be taken in a limiting sense.

A point to point connection can be made utilizing programmable pass-gate logic as shown in FIG. 3C and FIG. 3D. Multiple inputs (node A) can be connected to multiple outputs (node B) with a plurality of pass-gate logic elements. An SRAM base connection is shown in FIG. 4, where pass-gate 430 can be a PMOS or an NMOS transistor. NMOS is preferred due to its higher conduction. The gate voltage $S_0$ on NMOS transistor 410 gate electrode determines an ON or OFF connection. That logic level is generated by a configuration circuit 450 coupled to the gate of NMOS transistor 410. The pass-gate logic connection requires the configuration circuitry to generate signal $S_0$ with sufficient voltage levels to ensure off and on conditions. For an NMOS pass-gate, $S_0$ having a logic level one completes the point to point connection, while a logic level zero keeps them disconnected. In addition to using only an NMOS gate, a PMOS gate could also be used in parallel to make the connection. The configuration circuit 450 needs to then provide complementary outputs ($S_0$ and $S_0'$) to drive NMOS and PMOS gates in the connection. Configuration circuit 450 contains a memory element. Most CMOS SRAM memory delivers complementary outputs. This memory element can be configured by the user to select the polarity of $S_0$, thereby selecting the status of the connection. The memory element can be volatile or non-volatile. In volatile memory, it could be DRAM, SRAM, Optical or any other type of a memory device that can output a valid signal $S_0$. In non-volatile memory it could be fuse, anti-fuse, EPROM, EEPROM, Flash, Ferro-Electric, Magnetic or any other kind of memory device that can output a valid signal $S_0$. The output $S_0$ can be a direct output coupled to the memory element, or a derived output in the configuration circuitry. An inverter can be used to restore $S_0$ signal level to full rail voltage levels. The SRAM in configuration circuit 450 can be operated at an elevated Vcc level to output an elevated $S_0$ voltage level. This is especially feasible when the SRAM is built in a separate TFT module. Other configuration circuits to generate a valid $S_0$ signal are discussed next.

Figure 7:
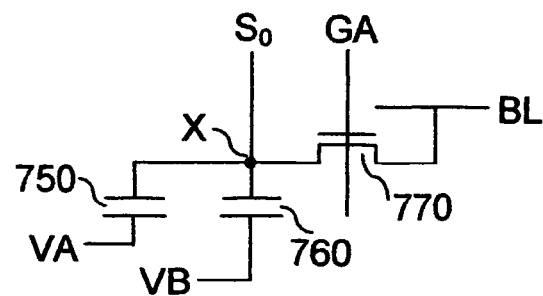
FIG. 7 shows a configuration circuit utilizing anti-fuse memory elements.

An anti-fuse based configuration circuit to use with this invention is shown next in FIG. 7. Configuration circuit 450 in FIG. 4B can be replaced with the anti-fuse circuit shown in FIG. 7. In FIG. 7, output level $S_0$ is generated from node X which is coupled to signals VA and VB via two anti-fuses 750 and 760 respectively. Node X is connected to a programming access transistor 770 controlled by gate signal GA and drain signal BL. A very high programming voltage is needed to blow the anti-fuse capacitor. This programming voltage level is determined by the anti-fuse properties, including the dielectric thickness. Asserting signal VA very high, VB low (typically ground), BL low and GA high (Vcc to pass the ground signal) provides a current path from VA to BL through the on transistor 770. A high voltage is applied across anti-fuse 750 to pop the dielectric and short the terminals. Similarly anti-fuse 760 can be programmed by selecting VA low, VB very high, BL low and GA high. Only one of the two anti-fuses is blown to form a short. When the programming is done, BL and GA are returned to zero, isolating node X from the programming path. VA=Vss (ground) and VB=Vcc (power, or elevated Vcc) is applied to the two signal lines. Depending on the blown fuse, signal $S_0$ will generate a logic low or a logic high signal. This is a one time programmable memory device. Node X will be always connected to VA or VB by the blown fuse regardless of the device power status. Signals GA and BL are constructed orthogonally to facilitate row and column based decoding to construct these memory elements in an array.

Figure 8A:
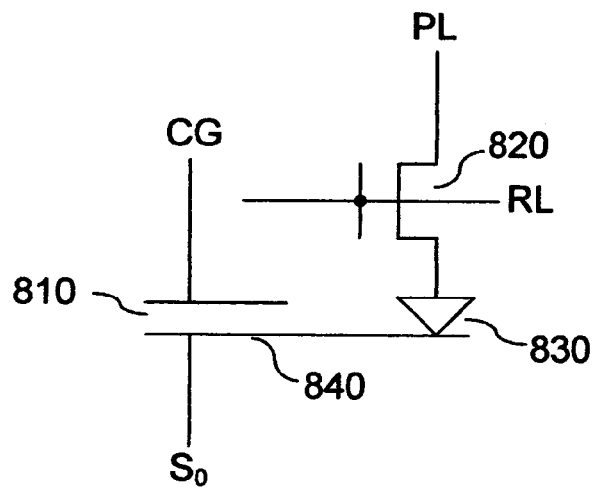
FIG. 8A shows a first embodiment of a configuration circuit utilizing a floating-gate.
Figure 8B:
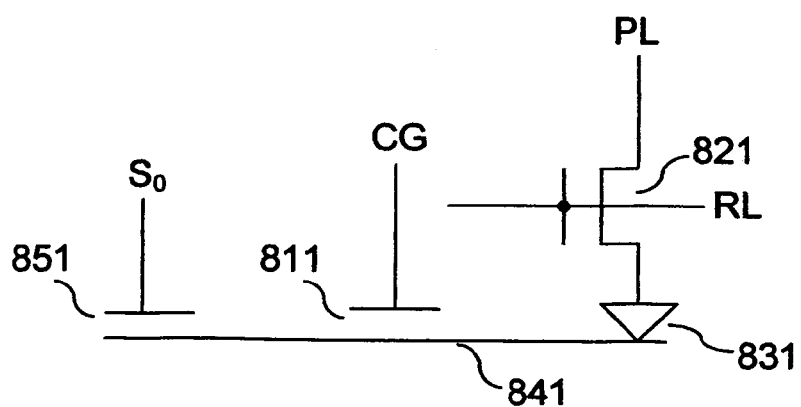
FIG. 8B shows a second embodiment of a configuration circuit utilizing a floating-gate.

FIG. 8 shows two EEPROM non-volatile configuration circuits that can be used in this invention. Configuration circuit 450 in FIG. 4B can be replaced with either of two EEPROM circuit shown in FIG. 8A and FIG. 8B. In FIG. 8, node 840 is a floating gate. This is usually a poly-silicon film isolated by an insulator all around. It is coupled to the source end of programming transistor 820 via a tunneling diode 830. The tunneling diode is a thin dielectric capacitor between floating poly and substrate silicon with high doping on either side. When a large programming (or erase) voltage Vpp is applied across the thin dielectric, a Fowler-Nordheim tunneling current flows through the oxide. The tunneling electrons move from electrical negative to electrical positive voltage. Choosing the polarity of the applied voltage across the tunneling dielectric, the direction of electron flow can be reversed. Multiple programming and erase cycles are possible for these memory elements. As the tunneling currents are small, the high programming voltage (Vpp) can be generated on chip, and the programming and erasure can be done while the chip is in a system. It is hence called in system programmable (ISP). An oxide or dielectric capacitor 810 couples the floating gate (FG) 840 to a control gate (CG). The control gate CG can be a heavily doped silicon substrate plate or a second poly-silicon plate above the floating poly. The dielectric can be oxide, nitride, ONO or any other insulating material. A voltage applied to CG will be capacitively coupled to FG node 840. The coupling ratio is designed such that 60–80 percent of CG voltage will be coupled to FG node 840. To program this memory element, a negative charge must be trapped on the FG 840. This is done by applying positive Vpp voltage on CG, ground voltage on PL and a sufficiently high (Vcc) voltage on RL. CG couples a high positive voltage onto FG 840 creating a high voltage drop across diode 830. Electrons move to the FG 840 to reduce this electric field When the memory device is returned to normal voltages, a net negative voltage remains trapped on the FG 840. To erase the memory element, the electrons must be removed from the floating gate. This can be done by UV light, but an electrical method is more easily adapted. The CG is grounded, a very high voltage (Vpp+more to prevent a threshold voltage drop across 820) is applied to RL, and a very high voltage (Vpp) is applied to PL. Now a low voltage is coupled to FG with a very high positive voltage on the source side of device 820. Diode 830 tunneling removes electrons from FG. This removal continues beyond a charge neutral state for the isolated FG. When the memory device is returned to normal voltages, a net positive voltage remains trapped on the FG 840. Under normal operation RL is grounded to isolate the memory element from the programming path, and PL is grounded. A positive intermediate voltage Vcg is applied to CG terminal. FG voltage is denoted $S_0$. Under CG bias, $S_0$ signal levels are designed to activate pass-gate logic correctly. Configuration circuit in FIG. 8B is only different to that in FIG. 8A by the capacitor 851 used to induce $S_0$ voltage. This is useful when $S_0$ output is applied to leaky pass-gates, or low level leakage nodes. As gate oxide thicknesses reach below 50 angstroms, the pass-gates leak due to direct tunneling.

Figure 9:
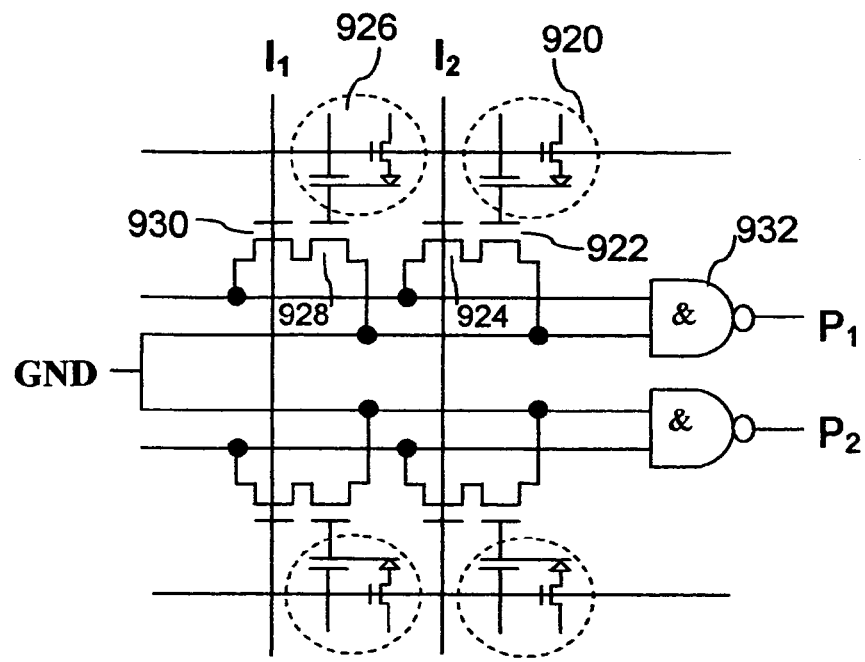
FIG. 9 shows a programmable AND array realization of floating-gate based memory elements.

These configuration circuits, and similarly constructed other configuration circuits, can be used in programmable logic devices. Those with ordinary skill in the art may recognize other methods for constructing configuration circuits to generate a valid $S_0$ output. FIG. 9 shows an FEPROM non-volatile memory element in the implementation of a Product-Term, also known as P-Term, in NAND-NOR logic. FIG. 9 shows two mirrored P-Term outputs P1 and P2. For output P1, an NAND gate 932 comprised of a pull-up device receives signals from pull down pass transistors 922, 924, 928 and 930. The pass transistor 922 is controlled by block 920 shown in the dashed circle, while the pass transistor 928 is controlled by a similar block 926 shown inside the dashed circle. These blocks 920 and 926 show the configuration circuits shown in FIG. 8A. Blocks 920 and 926 can be replaced by any one of configuration circuits shown in FIG. 4A, FIG. 7 or FIG. 8B to realize this logic function. Pass transistors 922, 924, 928, 930 and the NAND gate 932 show the logic block of the PLD. The logic block is not affected by the choice of the configuration circuit. This voltage output level applied to the gate of device 922 is designed to turn the device off or on at a designed control gate (CG) operating voltage.

SRAM memory technology has the advantage of not requiring a high voltage to configure memory. The SRAM based switch shown in FIG. 4B containing the SRAM memory circuit shown in FIG. 4A utilizes 6 extra configuration transistors, discounting the pass-gate 410, to provide the programmability. That is a significant overhead compared to application specific circuits where the point to point connection can be directly made with metal. Similarly other programmable memory elements capable of configuring pass-gate logic also carry a high silicon foot print. A cheaper method of constructing a vertically integrated SRAM cell is described in application Ser. No. 10/413,810 now U.S. Pat. No. 6,828,689 entitled "Semiconductor Latches and SRAM Devices", filed on Apr. 14, 2003 and list as inventor Mr. R. U. Madurawe, the contents of which are incorporated herein by reference. In a preferred embodiment, the configuration circuit is built on thin-film semiconductor layers located vertically above the logic circuits. The SRAM memory element, a thin-film transistor (TFT) CMOS latch as shown in FIG. 4A, comprises two lower performance back to back inverters formed on two semiconductor thin film layers, substantially different from a first semiconductor single crystal substrate layer and a gate poly layer used for logic transistor construction. This latch is stacked above the logic circuits for slow memory applications with no penalty on Silicon area and cost. This latch is adapted to receive power and ground voltages in addition to configuration signals. The two programming access transistors for the TFT latch are also formed on thin-film layers. Thus in FIG. 4B, all six configuration transistors shown in 450 are constructed in TFT layers, vertically above the pass transistor 410. Transistor 410 is in the conducting path of the connection and needs to be a high performance single crystal Silicon transistor. This vertical integration makes it economically feasible to add an SRAM based configuration circuit at a very small cost overhead to create a programmable solution. Such vertical integration can be extended to all other memory elements that can be vertically integrated above logic circuits.

A new kind of a programmable logic device utilizing thin-film transistor configurable circuits is disclosed in application Ser. No. 10/267,483 entitled "Three Dimensional Integrated Circuits", application Ser. No. 10/267,484 entitled "Methods for Fabricating Three-Dimensional Integrated Circuits", and application Ser. No. 10/267,511 now U.S. Pat. No. 6,747,478 entitled "Field Programmable Gate Array With Convertibility to Application Specific Integrated Circuit", all of which were filed on Oct. 8, 2002 and list as inventor Mr. R. U. Madurawe, the contents of which are incorporated-by-reference. The disclosures describe a programmable logic device and an application specific device fabrication from the same base Silicon die. The PLD is fabricated with a programmable memory module, while the ASIC is fabricated with a conductive pattern in lieu of the memory. Both memory module and conductive pattern provide identical control of logic circuits. For each set of memory bit patterns, there is a unique conductive pattern to achieve the same logic functionality. The vertical integration of the configuration circuit leads to a significant cost reduction for the PLD, and the elimination of TFT memory for the ASIC allows an additional cost reduction for the user. The TFT vertical memory integration scheme is briefly described next.

Figure 10:
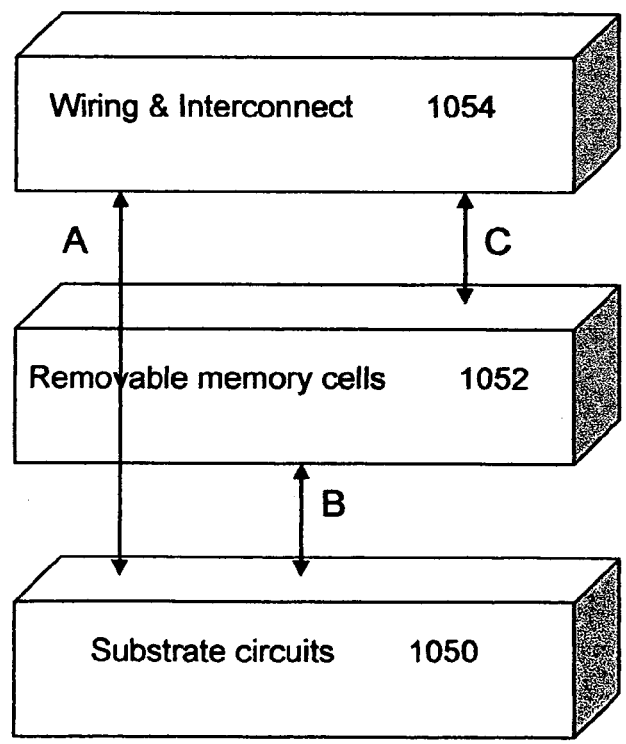
FIG. 10 shows a 3-dimensional construction of a programmable device.

FIG. 10 shows an implementation of vertically integrated circuits, where the configuration memory element is located above logic. The memory element can be any one of fuse links, anti-fuse capacitors, SRAM cells, DRAM cells, metal optional links, EPROM cells, EEPROM cells, flash cells, ferro-electric elements, optical elements and magnetic elements that lend to this implementation. SRAM memory is used herein to illustrate the scheme and is not to be taken in a limiting sense. First, silicon transistors 1050 are deposited on a substrate. A module layer of removable SRAM cells 1052 are positioned above the silicon transistors 1050, and a module layer of interconnect wiring or routing circuit 1054 is formed above the removable memory cells 1052. To allow this replacement, the design adheres to a hierarchical layout structure. As shown in FIG. 10, the SRAM cell module is sandwiched between the single crystal device layers below and the metal layers above electrically connecting to both. It also provides through connections "A" for the lower device layers to upper metal layers. The SRAM module contains no switching electrical signal routing inside the module. All such routing is in the layers above and below. Most of the programmable element configuration signals run inside the module. Upper layer connections to SRAM module "C" are minimized to Power, Ground and high drive data wires. Connections "B" between SRAM module and single crystal module only contain logic level signals and replaced later by Vcc and Vss wires. Most of the replaceable programmable elements and its configuration wiring is in the "replaceable module" while all the devices and wiring for the end ASIC is outside the "replaceable module". In other embodiments, the replaceable module could exist between two metal layers or as the top most module layer satisfying the same device and routing constraints. This description is equally applicable to any other configuration memory element, and not limited to SRAM cells.

Fabrication of the IC also follows a modularized device formation. Formation of transistors 1050 and routing 1054 is by utilizing a standard logic process flow used in the ASIC fabrication. Extra processing steps used for memory element 1052 formation are inserted into the logic flow after circuit layer 1050 is constructed. A full disclosure of the vertical integration of the TFT module using extra masks and extra processing is in the incorporated by reference applications discussed above.

During the customization, the base die and the data in those remaining mask layers do not change making the logistics associated with chip manufacture simple. Removal of the SRAM module provides a low cost standard logic process for the final ASIC construction with the added benefit of a smaller die size. The design timing is unaffected by this migration as lateral metal routing and silicon transistors are untouched. Software verification and the original FPGA design methodology provide a guaranteed final ASIC solution to the user. A full disclosure of the ASIC migration from the original FPGA is in the incorporated by reference applications discussed above.

The ASIC migration path for the point to point connection in FIG. 4B and the 2:1 MUX in FIG. 5A are illustrated in FIG. 11A and FIG. 11B respectively. In FIG. 11A, the gate input signal to pass-gate 1110 is mapped to two possible conductive pattern connections: connection 1130 to Vss and connection 1140 to Vcc. The connections are made in metal or contacts between metal during the fabrication process. Based on the $S_0$ output state being 0 or 1 of a memory pattern to map into a conductive pattern, either Vss or the Vcc connection is chosen. For each memory bit state, only one conductive pattern connection is made. Similarly in FIG. 11B, pass-gate 1101 has conductive pattern options to Vss and Vcc at nodes 1131 and 1141 respectively. Pass-gate 1102 has conductive pattern options to Vss and Vcc at nodes 1132 and 1142 respectively. Neither or one of $I_0$ and $I_1$ can be connected to O from this option. Comparing FIG. 4A with FIG. 11A and FIG. 9A with FIG. 11B, the point to point connection is identical between the two configuration options: memory element and conductive pattern. The signal delay through these pass-gate connections also remains identical, independent of the control option. Timing characteristics of complex designs utilizing a plurality of these switches also stay intact during the conversion.

In a second embodiment for the conductive pattern, the pass-gate 1110 drain is shorted to source in FIG. 11A by a metal wire when $S_0=1$. Wire resistance is reduced by eliminating pass-gate 1110 ON resistance from the signal path. When $S_0=0$, the pass-gate is left connected to Vss to eliminate floating nodes. The signal delay will be altered between the conducting pattern and memory options. That change can be emulated in the FPGA by raising only SRAM memory Vcc, raising $S_0$ voltage to reduce 1110 ON resistance. As the FPGA is not meant for manufacturing under this scenario, time dependant die electric breakdown (TDDB) driven reliability is not an issue. This may be desirable to users who need higher performance tweak for the ASIC and field test the tweak for no other timing violations prior to conversion.

In FIG. 10, the third module layer is formed substantially above the first and second module layers, wherein interconnect and routing signals are formed to connect the circuit blocks within the first and second module layers. Alternatively, the third module layer can be formed substantially below the first and second module layer with interconnect and routing signals formed to connect the circuit blocks within the first and second module layers. Alternatively, the third and fourth module layers positioned above and below the second module layer respectively, wherein the third and fourth module layers provide interconnect and routing signals to connect the circuit blocks within the first and second module layers.

In yet another embodiment of a programmable multi-dimensional semiconductor device, a first module layer is fabricated having a plurality of circuit blocks formed on a first plane. The programmable multi-dimensional semiconductor device also includes a second module layer formed on a second plane. A plurality of configuration circuits is then formed in the second plane to store instructions to control a portion of the circuit blocks.

The fabrication of thin-film transistors to construct configuration circuits is discussed next. A full disclosure is provided in application Ser. No. 10/413,809 entitled "Semiconductor Switching Devices", filed on Apr. 14, 2003, which lists as inventor Mr. R. U. Madurawe, the contents of which are incorporated herein by reference.

The following terms used herein are acronyms associated with certain manufacturing processes. The acronyms and their abbreviations are as follows:

| | |
|---|---|
| $V_T$ | Threshold voltage |
| LDN | Lightly doped NMOS drain |
| LDP | Lightly doped PMOS drain |
| LDD | Lightly doped drain |
| RTA | Rapid thermal annealing |
| Ni | Nickel |
| Ti | Titanium |
| TiN | Titanium-Nitride |
| W | Tungsten |
| S | Source |
| D | Drain |
| G | Gate |
| ILD | Inter layer dielectric |
| C1 | Contact-1 |
| M1 | Metal-1 |
| P1 | Poly-1 |
| P− | Positive light dopant (Boron species, $BF_2$) |
| N− | Negative light dopant (Phosphorous, Arsenic) |
| P+ | Positive high dopant (Boron species, $BF_2$) |
| N+ | Negative high dopant (Phosphorous, Arsenic) |
| Gox | Gate oxide |
| C2 | Contact-2 |
| LPCVD | Low pressure chemical vapor deposition |
| CVD | Chemical vapor deposition |
| ONO | Oxide-nitride-oxide |
| LTO | Low temperature oxide |

A logic process is used to fabricate CMOS devices on a substrate layer for the fabrication of storage circuits. These CMOS devices may be used to build AND gates, OR gates, inverters, adders, multipliers, memory and pass-gate based logic functions in an integrated circuit. A CMOSFET TFT module layer or a Complementary gated FET (CGated-FET) TFF module layer may be inserted to a logic process at a first contact mask to build a second set of TFT MOSFET or Gated-FET devices. Configuration circuitry is build with these second set of transistors. An exemplary logic process may include one or more following steps:

P-type substrate starting wafer
Shallow Trench isolation: Trench Etch, Trench Fill and CMP
Sacrificial oxide
PMOS VT mask & implant
NMOS VT mask & implant
Pwell implant mask and implant through field
Nwell implant mask and implant through field
Dopant activation and anneal
Sacrificial oxide etch
Gate oxidation/Dual gate oxide option
Gate poly (GP) deposition
GP mask & etch
LDN mask & implant
LDP mask & implant
Spacer oxide deposition & spacer etch
N+ mask and NMOS N+ G, S, D implant
P+ mask and PMOS P+ G, S, D implant
Ni deposition
RTA anneal—Ni salicidation (S/D/G regions & interconnect)
Unreacted Ni etch
ILD oxide deposition & CMP FIG. 12 shows an exemplary process for fabricating a thin film MOSFET latch in a module layer. In one embodiment the process in FIG. 12 forms the latch in a layer substantially above the substrate layer. The processing sequence in FIG. 12.1 through 12.7 describes the physical construction of a MOSFET device for storage circuits 450 shown in FIG. 4B. The process of FIG. 12 includes adding one or more following steps to the logic process after ILD oxide CMP step.

C1 mask & etch
W-Silicide plug fill & CMP
~300 A poly P1 (crystalline poly-1) deposition
P1 mask&etch
Blanket Vtn P– implant (NMOS Vt)
Vtp mask & N– implant (PMOS Vt)
TFT Gox (70 A PECVD) deposition
500 A P2 (crystalline poly-2) deposition
P2 mask & etch
Blanket LDN NMOS N– tip implant
LDP mask and PMOS P– tip implant
Spacer LTO deposition
Spacer LTO etch to form spacers & expose P1
Blanket N+ implant (NMOS G/S/D & interconnect)
P+ mask & implant (PMOS G/S/D & interconnect)
Ni deposition
RTA salicidation and poly recrystallization (G/S/D regions & interconnect)
Dopant activation anneal
Excess Ni etch
ILD oxide deposition & CMP
C2 mask & etch
W plug formation & CMP
M1 deposition and back end metallization The TFT process technology consists of creating NMOS & PMOS poly-silicon transistors. In the embodiment in FIG. 12, the module insertion is after the substrate device gate poly etch and the ILD film is deposition. In other embodiments the insertion point may be after M1 and the ILD is deposition, prior to V1 mask, or between two metal definition steps.

After gate poly of regular transistors are patterned and etched, the poly is salicided using Nickel & RTA sequences. Then the ILD is deposited, and polished by CMP techniques to a desired thickness. In the shown embodiment, the contact mask is split into two levels. The first C1 mask contains all contacts that connect latch outputs to substrate transistor gates and active nodes. Then the C1 mask is used to open and etch contacts in the ILD film. Ti/TiN glue layer followed by W-Six plugs, W plugs or Si plugs may be used to fill the plugs, then CMP polished to leave the fill material only in the contact holes. The choice of fill material is based on the thermal requirements of the TFT module.

Then, a first P1 poly layer, amorphous or crystalline, is deposited by LPCVD to a desired thickness as shown in FIG. 12.1. The P1 thickness is between 50 A and 1000 A, and preferably 250 A. This poly layer P1 is used for the channel, source, and drain regions for both NMOS and PMOS TFT's. It is patterned and etched to form the transistor body regions. In other embodiments, P1 is used for contact pedestals. NMOS transistors are blanket implanted with P-doping, while the PMOS transistor regions are mask selected and implanted with N– doping. This is shown in FIG. 12.2. The implant doses and P1 thickness are optimized to get the required threshold voltages for PMOS & NMOS devices under fully depleted transistor operation, and maximize on/off device current ratio. The pedestals implant type is irrelevant at this point. In another embodiment, the $V_T$ implantation is done with a mask P– implant followed by masked N– implant. First doping can also be done in-situ during poly deposition or by blanket implant after poly is deposited.

Patterned and implanted P1 may be subjected to dopant activation and crystallization. In one embodiment, RTA cycle is used to activate & crystallize the poly after it is patterned to near single crystal form. In a second embodiment, the gate dielectric is deposited, and buried contact mask is used to etch areas where P1 contacts P2 layer. Then, Ni is deposited and salicided with RTA cycle. All of the P1 in contact with Ni is salicided, while the rest poly is crystallized to near single crystal form. Then the unreacted Ni is etched away. In a third embodiment, amorphous poly is crystallized prior to P1 patterning with an oxide cap, metal seed mask, Ni deposition and MILC (Metal-Induced-Lateral-Crystallization).

Then the TFT gate dielectric layer is deposited followed by P2 layer deposition. The dielectric is deposited by PECVD techniques to a desired thickness in the 30–200 A range, desirably 70 A thick. The gate may be grown thermally by using RTA. This gate material could be an oxide, nitride, oxynitride, ONO structure, or any other dielectric material combination used as gate dielectric. The dielectric thickness is determined by the voltage level of the process. At this point an optional buried contact mask (BC) may be used to open selected P1 contact regions, etch the dielectric and expose P1 layer. BC could be used on P1 pedestals to form P1/P2 stacks over C1. In the P1 salicided embodiment using Ni, the dielectric deposition and buried contact etch occur before the crystallization. In the preferred embodiment, no BC is used.

Then second poly P2 layer, 300 A to, 2000 A thick, preferably 500 A is deposited as amorphous or crystalline poly-silicon by LPCVD as shown in FIG. 12.3. P2 layer is defined into NMOS & PMOS gate regions intersecting the P1 layer body regions, C1 pedestals if needed, and local interconnect lines and then etched. The P2 layer etching is continued until the dielectric oxide is exposed over P1 areas uncovered by P2 (source, drain, P1 resistors). The source & drain P1 regions orthogonal to P2 gate regions are now self aligned to P2 gate edges. The S/D P2 regions may contact P1 via buried contacts. NMOS devices are blanket implanted with LDN N− dopant. Then PMOS devices are mask selected and implanted with LDP P− dopant as shown in FIG. 12.4. The implant energy ensures full dopant penetration through the residual oxide into the S/D regions adjacent to P2 layers.

A spacer oxide is deposited over the LDD implanted P2 using LTO or PECVD techniques. The oxide is etched to form spacers. The spacer etch leaves a residual oxide over P1 in a first embodiment, and completely removes oxide over exposed P1 in a second embodiment. The latter allows for P1 salicidation at a subsequent step. Then NMOS devices & N+ poly interconnects are blanket implanted with N+. The implant energy ensures full or partial dopant penetration into the 100 A residual oxide in the S/D regions adjacent to P2 layers. This doping gets to gate, drain & source of all NMOS devices and N+ interconnects. The P+ mask is used to select PMOS devices and P+ interconnect, and implanted with P+ dopant as shown in FIG. 12.5. PMOS gate, drain & source regions receive the P+ dopant. This N+/P+ implants can be done with N+ mask followed by P+ mask. The $V_T$ implanted P1 regions are now completely covered by P2 layer and spacer regions, and form channel regions of NMOS & PMOS transistors.

After the P+/N+ implants, Nickel is deposited over P2 and salicided to form a low resistive refractory metal on exposed poly by RTA. Un-reacted Ni is etched as shown in FIG. 12.6. This 100 A–500 A thick Co-salicide connects the opposite doped poly-2 regions together providing low resistive poly wires for data. In one embodiment, the residual gate dielectric left after the spacer prevents P1 layer salicidation. In a second embodiment, as the residual oxide is removed over exposed P1 after spacer etch, P1 is salicided. The thickness of Ni deposition may be used to control full or partial salicidation of P1 regions. Fully salicided S/D regions up to spacer edge facilitate high drive current due to lower source and drain resistances.

An LTO film is deposited over P2 layer, and polished flat with CMP. A second contact mask C2 is used to open contacts into the TFT P2 and P1 regions in addition to all other contacts to substrate transistors. In the shown embodiment, C1 contacts connecting latch outputs to substrate transistor gates require no C2 contacts. Contact plugs are filled with tungsten, CMP polished, and connected by metal as done in standard contact metallization of IC's as shown in FIG. 12.7.

A TFT process sequence similar to that shown in FIG. 12 can be used to build complementary Gated-FET thin film devices. Compared with CMOS devices, these are bulk conducting devices and work on the principles of JFETs. A full disclosure of these devices are provided in application Ser. No. 10/413,808 entitled "Insulated-Gate Field-Effect Thin Film Transistors", filed on Apr. 14, 2003 and list as inventor Mr. R. U. Madurawe, the contents of which are incorporated herein by reference. The process steps facilitate the device doping differences between MOSFET and Gated-FET devices, and simultaneous formation of complementary Gated-FET TFT devices. A detailed description for this process was provided when describing FIG. 12 earlier and is not repeated. An exemplary CGated-FET process sequence may use one or more of the following steps:

C1 mask & etch
W-Silicide plug fill & CMP
~300 A poly P1 (crystalline poly-1) deposition
P1 mask & etch
Blanket Vtn N− implant (Gated-NFET $V_T$)
Vtp mask & P− implant (Gated-PFET $V_T$)
TFT Gox (70 A PECVD) deposition
500 A P2 (crystalline poly-2) deposition
Blanket P+ implant (Gated-NFET gate & interconnect)
N+ mask & implant (Gated-PFET gate & interconnect)
P2 mask & etch
Blanket LDN Gated-NFET N tip implant
LDP mask and Gated-PFET P tip implant
Spacer LTO deposition
Spacer LTO etch to form spacers & expose P1
Ni deposition
RTA salicidation and poly re-crystallization (exposed P1 and P2)
Fully salicidation of exposed P1 S/D regions
Dopant activation anneal
Excess Ni etch
ILD oxide deposition & CMP
C2 mask & etch
W plug formation & CMP
M1 deposition and back end metallization As the discussions demonstrate, memory controlled pass transistor logic elements provide a powerful tool to make switches. The ensuing high cost of memory can be drastically reduced by the 3-dimensional integration of configuration elements and the replaceable modularity concept for said memory. These advances allow designing a routing block to overcome the deficiencies in current FPGA designs. In one aspect, a cheaper memory element allows use of more memory for programmability. That enhances the ability to build large logic blocks (i.e. course-grain advantage) while maintaining smaller element logic fitting (i.e. fine-grain advantage). Furthermore larger grains need less connectivity: neighboring cells and far-away cells. That further simplifies the interconnect structure. A new interconnect structure utilizing the methods shown so far is discussed next.

A point to point switch in accordance with this teaching is shown in FIG. 13A. In that, point A is connected to point B with a substrate NMOS pass-gate 1310. Unlike U.S. Pat. No. 6,515,511 where the pass-gate is a thin-film transistor, this device is a high performance single crystal Si device to provide high conducting current when the device is on. The low performance TFT transistors are only used to build the configuration circuits shown in dotted box 1350. Configuration circuit 1350 is located vertically above the pass-gate transistor 1310. The configuration circuit 1350 includes a thin film transistor memory element. This memory element is either a volatile or a non volatile memory element. The volatile memory is comprised of DRAM, SRAM or optical memory device. The non-volatile memory is comprised of EPROM, EEPROM, ferro-electric, magnetic, fuse-link or anti-fuse element. FIG. 13A illustrates an SRAM embodiment for configuration circuit. The configuration circuit 1350 outputs a control signal $S_0$ to control pass-gate 1310. This $S_0$ voltage level may be at Vcc or ground based on memory bit polarity. The $S_0$ voltage may also be at an elevated Vcc when the SRAM is run at that higher Vcc level. The configuration circuit 1350 includes circuitry to write data into the memory element. Thus output $S_0$ can be programmed to logic 1 or logic 0 by changing memory bit polarity. The configuration circuit includes a plurality of memory bits to program a plurality of pass-gates. The memory elements in the configuration circuit are arranged in an array fashion to allow either individual access or row by row access or column by column access to memory elements. The configuration memory circuit includes generic SRAM memory based capability to store user specified data.

Configuration circuit includes metal wires to provide some limited configuration signals, power and ground to memory elements. In one embodiment the SRAM memory is comprised of TFT devices to form the circuit shown in FIG. 4A, further comprising TFT transistors 401 and 402 to access the latch, and TFT CMOS inverters 403 and 404 to form a bistable latch. In preferred embodiment, signal line $S_0$ is provided to pass-gate 1310 in FIG. 13A by a contact plug formed through the insulator separating substrate transistors and TFT transistors.

The point to point switch with TFT configuration circuits in FIG. 13A is denoted by the symbol as shown in FIG. 13B. In FIG. 13B, the circle with a cross represents the vertically integrated configuration circuit containing a TFT SRAM memory (or any other 3-dimentional memory) element. The pass-gate in FIG. 13B represents a single crystal Silicon transistor fabricated on a substrate. This pass-gate could be constructed on SOI substrate, with TFT integrated above that to form configuration memory. A 4×4 Programmable cross-point switch matrix utilizing the point to pint switch in FIG. 13A is shown in FIG. 13C. In FIG. 13C, every intersection point between the V-lines (V1 to V4) and H-lines (H1 to H4) is populated with a point to point switch. This could be fully populated as shown, or partially populated depending on the need. The configuration circuit for FIG. 13C has 16 memory elements and configuration access to change the memory data. A programmable means to configure the cross-point matrix include setting memory data to achieve a user specified connecting pattern. Compared to standard planar SRAM technology, the new cross-point switch has only the 16 wide pass-gates on the substrate, and 96 TFT transistors are moved vertically above that. SRAM contain CMOS structures and is impacted by N-well related spacing rules for latch-up prevention. For a typical 6 times the minimum width wide pass-gate area of 1×, 96 SRAM transistors take 2× more silicon foot print requiring a 3× silicon for the matrix. TFT has no such latch-up restrictions and both pass-gates and TFT SRAM take about the same layout area and 1× total Silicon. The new point to point switch allows almost a 66% reduction in silicon utilization for such wire connections.

Figure 6C:
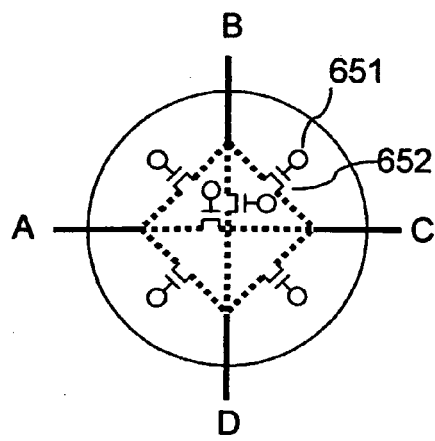
FIG. 6C shows an exemplary 6 pass-gate Bridge to connect four points.
Figure 14A:
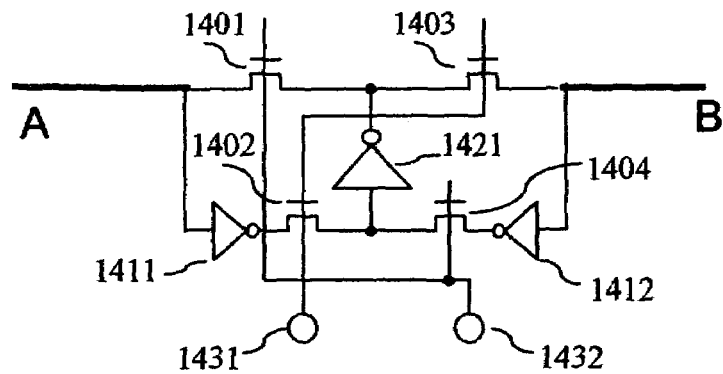
FIG. 14A shows a first embodiment of a programmable bi-directional buffer connecting two wires.

A new programmable tri-state buffer for programmable logic applications is discussed next. This new programmable tri-state buffer is connected between two horizontal (H) and vertical (V) lines, or to provide a buffered signal from A to B as shown in FIG. 6A and FIG. 6B. A process technology independent programmable buffer circuit is shown in FIG. 14A. In FIG. 14A, NMOS transistors 1401–1404 represent the pass-gate 330 shown in FIG. 3C. These could be PMOS or complementary CMOS pass-gates that allows a signal to traverse when on, and that blocks a signal when off. Inverters 1411 and 1412 constitute the first stage of a buffer, and have a smaller width dimension. The trip point of these inverters is adjusted to optimize signal arrival at A or B ends. Inverter 1421 comprises the large width that drives the signal through the next wire stage. All these components are constructed as high mobility devices to optimize signal transmission through the wires. Configuration elements 1431 and 1432 represent the 6T SRAM cell 450 shown in FIG. 4B, or element 1350 in FIG. 13A. These elements could be two separate memory elements, or combined into a single memory element with complementary output levels as shown in FIG. 6B. Two separate elements would allow to tri-state the buffer. It could be any one of configuration circuits as illustrated in FIG. 7 and FIG. 8, and could be comprised of any non-volatile or volatile memory element. A vertically located memory element, such as laser-fuse circuits or TFT configuration circuit is preferred for this construction to reduce cost. The entire circuit in FIG. 14A can be easily constructed using standard CMOS logic to perform the same function at a higher Silicon foot print. Inside configuration circuit 1431, a memory element holds a data state. If 1431 holds a data state 1 and 1432 holds a data state 0, pass-gates 1402 and 1403 are activated, and pass-gates 1401 and 1404 are turned off. Then data signals arriving at port A are buffered thru inverters 1411 and 1421 and transmitted to wire B. If 1431 holds a 0 and 1432 holds a 1, data signals arriving in B is buffered and transmitted to A. This provides a bi-directional drive to the connection between A and B. Both 1431 and 1432 are not allowed to hold a data state 1, while both 1431 and 1432 hold a data state 0 to tri-state the connection. Compared to the buffer shown in FIG. 6B which has two large inverters, this scheme only requires one large inverter 1421. Furthermore, smaller inverters 1411 and 1412 provide drive to transmit signals thru the on resistive pass-gates 1402 and 1404 respectively. The new buffer has four pass-gates compared to the two pass-gates in the buffer shown in FIG. 6B. There is a net saving in Si area with two extra NMOS transistors, and one less high drive buffer stage.

Figure 14B:
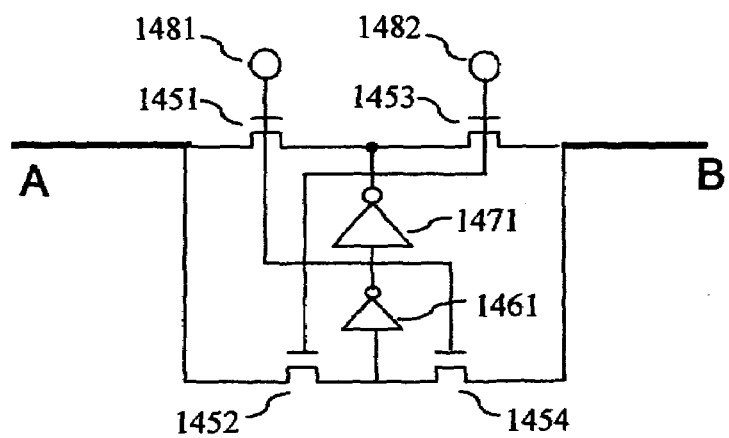
FIG. 14B shows a second embodiment of a programmable bi-directional buffer connecting two wires.

A second embodiment of the new bi-directional buffer is shown in FIG. 14B. Compared to FIG. 14A, only one smaller inverter 1461 is provided. Signal drive at the origin of either A or B needs to drive the signal thru the first level of input pass-gates 1452 and 1454. Inverters 1461 and 1471 sized appropriately buffers the signal and drives thru the selected output pass-gate 1451 or 1452. The output pass-gates are sized with large W to reduce the resistance. The memory bits in configuration circuits 1481 and 1482 holds data to select the input, buffer the signal and transmit to output just as with FIG. 14A. Compared to FIG. 6B, this has only one buffer and saves considerable Si area and cost. When the memory is located in a vertical plane above the logic transistor, a higher voltage compared to logic Vcc can be applied to the memory element to provide a boosted control signal on the pass-gate gate terminal. That voltage level will prevent the loss of the threshold voltage Vt for signals propagating through the pass-gates.

Figure 6D:
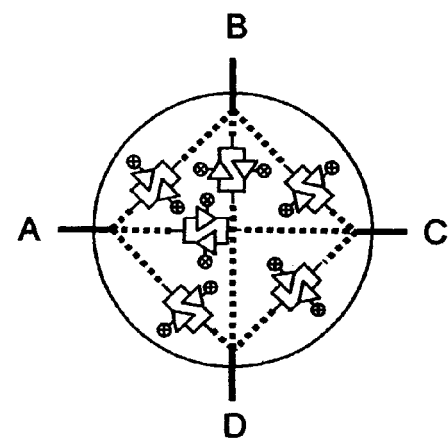
FIG. 6D shows a first bi-directionally buffered Bridge to connect four points.
Figure 6E:
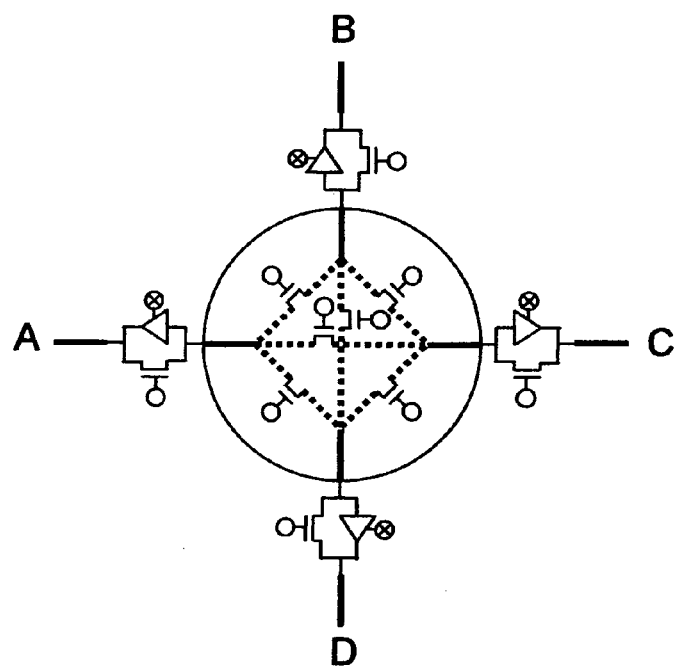
FIG. 6E shows a second bi-directionally buffered Bridge to connect four points.
Figure 15:
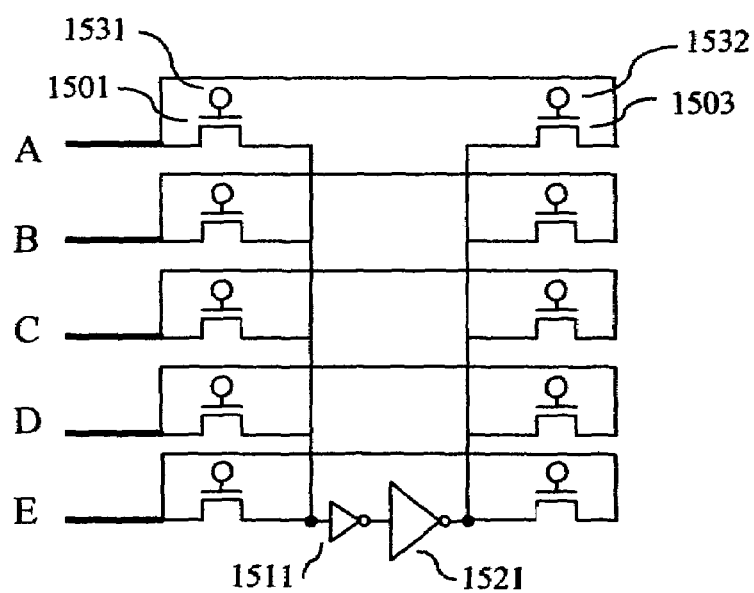
FIG. 15 shows a first embodiment of a programmable bi-directional buffer Bridge connecting multiple wires.

FIG. 15 illustrates a bridge according to this innovation to reduce the total number of bi-directional buffers needed to construct a 5 terminal bridge. This bridge can be adapted to connect any number of wires. For N ports in the bridge, only one buffer such as the inverter pair 1511 & 1521 is needed. The bridge shown in FIG. 6D needed ($N^2$-N) buffers, the bridge shown in FIG. 6E needed 4N buffers, and the bridge in FIG. 15 needs only 1 buffer. Such a bridge is extremely useful to provide bi-directional buffer connections across a high number of wires. In FIG. 15, the inputs A–E are multiplexed thru pass-gates 1501 to the input of the inverter 1511, then to inverter 1521. The buffered output is multiplexed thru pass-gates 1503 back to the same wires A–E. The input MUX is programmed by memory bits 1531, while the output MUX is programmed by memory bits 1532. Only one input, and one output memory bit is programmed to hold logic 1, thereby selecting the input wire on which data arrives, and the output wire on which data departs. Programming all bits to hold logic 0 will tri-state the bridge, with no wires connected to each other. The direction of wires in FIG. 15 need not be parallel as drawn; rather they can run in any direction. In a first instance, A, B, C and D can be oriented North, South, East and West when viewed from the top with the buffer at the center. In a second instance, the wires could run in three directions, or two directions with the buffer located at the center. In yet another embodiment, each wire A–E represents a bundle of wires. For example A is a first group of wires $A_1, A_2, \ldots, A_n$ running in a first direction, B is a second group of wires $B_1, B_2, \ldots, B_n$ running in a second direction, etc. The first bridge connects $A_1$, $B_1$, $C_1$, $D_1$ and $E_1$ as shown in FIG. 15. The second bridge connects $A_2$, $B_2$, $C_2$, $D_2$ and $E_2$ as shown in FIG. 15. Finally the $n^{th}$ bridge connects $A_n$, $B_n$, $C_n$, $D_n$ and $E_n$ as shown in FIG. 15. This provides a bi-directional buffered switch block for bundles of terminating wires in an FPGA. In another embodiment, wires E could be the same bundle of wires as B, with the numbering of the wires shifted. For example wire $E_1$ is the same as wire $B_5$, $E_2$ is same as $B_6$, etc. That provides a modulo n rotating scheme where $E_m = (B_{m+4}:$ modulo_n) for all m=1 to n.

The bridge shown in FIG. 15 can be utilized to select an input signal from any given wire, and transmit a buffered signal on more than just one wire. This is achieved by selecting more than one output wire from the output MUX pass-gates 1503 by programming those bits in 1532 to hold data 1. The output cannot be routed back to the same input wire, but it can be routed to any one of the other wires in the bridge. Such interconnect routing is very useful for high fan out nets, and allow great flexibility for fast timing driven routing in software tools.

Figure 16:
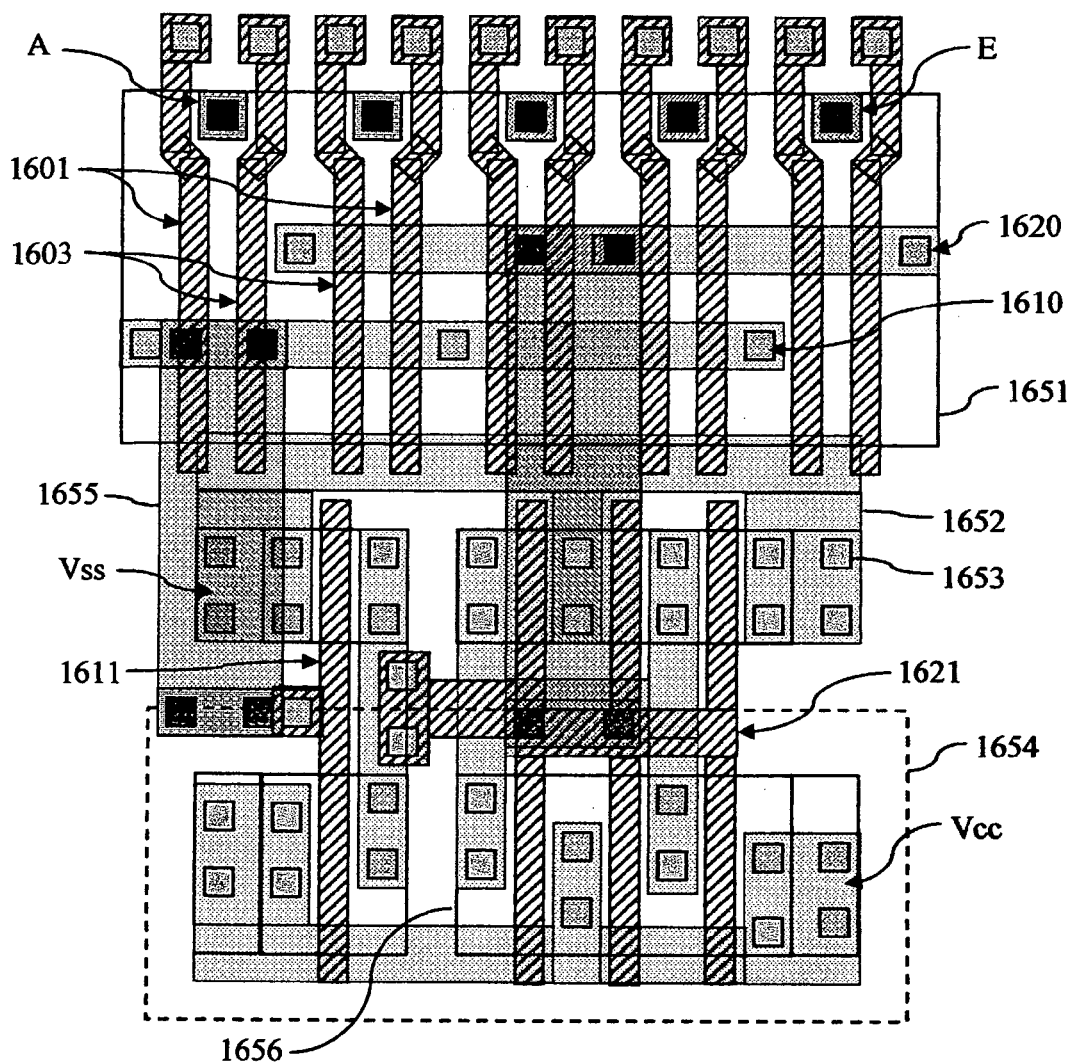
FIG. 16 shows an area efficient layout of the Bridge shown in FIG. 15.

The new bi-directional buffer shown in FIG. 15 lends to a very efficient Si utilization layout as shown in FIG. 16. In FIG. 16, the wires A–E enter an inter-leaved MUX as shown. There are 5 input side pass-gates such as 1601, and there are 5 output side pass-gates such as 1603 sharing the wires. The common output node 1620 couples to wires A–E thru the output pass-gates 1603. Similarly, the input common node 1610 couples to wires A–E thru the input pass-gates 1601. Each pass-gate is a wide width transistor to minimize the on resistance and improve transit times. The common input node 1610 couples to the input of the first inverter 1611. The output of the first inverter couples to the input of the second inverter 1621. Inverter 1611 has three legs to provide the required drive strength. The exact transistor sizing is achieved thru spice simulations to minimize the wire delays thru the segmented portions. In FIG. 16, 1651 is N-type active regions for NMOS transistors in P-well regions; 1652 is metal-1; 1653 is metal-1 contacts to active regions; 1654 is N-well regions for PMOS transistors; 1655 is metal-2; and 1656 is P-type active regions for PMOS transistors in N-well regions. Nodes 1601 and 1603 show poly gate regions over active area. The common wires A–E for inputs and outputs in FIG. 15 allow the two MUXs comprising pass-gates 1601 and pass-gates 1603 to share the nodes A–E as shown in FIG. 16. The configuration circuits are located in a vertical plane, and hence not shown in FIG. 16. Thus only the pass-gate MUXs and buffer contribute to the Si foot-print.

Figure 17:
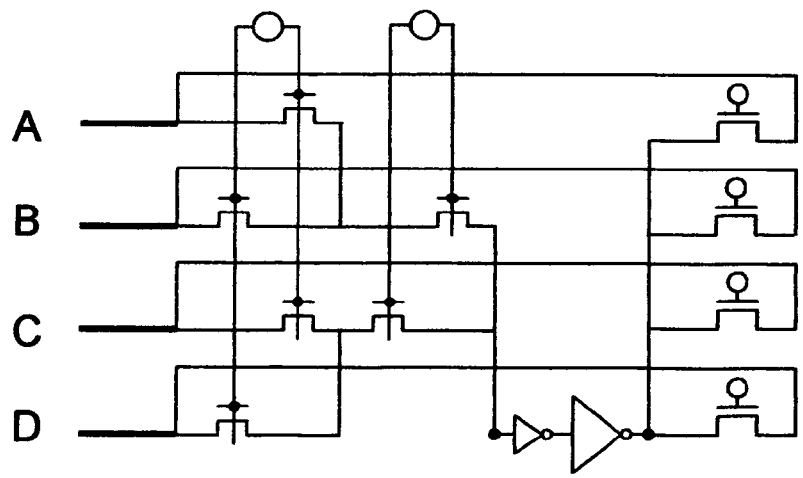
FIG. 17 shows a second embodiment of a programmable bi-directional buffer Bridge connecting multiple wires.

Another embodiment of a four port bridge is shown in FIG. 17. In FIG. 17, the even number of ports allows the MUXs to be constructed in stages. For 4-inputs A–D, the input MUX is shown to comprise two stages. The two-stage MUX is exactly the same structure shown in FIG. 5B. One of the wires A–D is always connected to the input of the buffer. By selecting the 2-bit polarity, any one input from A–D can be coupled to this input of the buffer. On the output side, there are 4-bits controlling four pass-gates. All bits can be turned off to decouple output buffer from all the wires. Only one bit in the output MUX is programmed to couple the selected input wire to the desired output wire. This MUX has the advantage of saving 2 memory bits at the expense of two pass-gates compared to the bridge in FIG. 15. MUXs take Si real estate in both horizontal (example standard CMOS technology) and vertical memory (example TFT SRAM memory technology) layouts, while memory only takes Si real estate in horizontal memory layouts. Thus FIG. 17 has better value in CMOS technologies.

In this disclosure, new programmable buffers are described to route data across terminating wires. These buffers and pass-gates are used to build very powerful bridge structures capable of multi-length global wire routing in FPGAs. Bi-directional data wires with programmable buffers having tri-state capability offer predictable and fast data transfer along long wires. It allows an FPGA construction where all wires are available for a soft-ware placement and route tool to connect randomly placed logic. These buffers can be selected, or deselected by the user. Such selections allow software timing models to accurately predict randomly placed logic delays through the chip. These buffers enable multi level wire partitioning, predictability in wire delays and an overall wire delay reduction More importantly, these bi-directional buffers allow a significant cost reduction in the switch blocks of an FPGA, and an overall wire reduction for efficient logic routing. The bi-directional data wire constructions in FPGA's enhance fitting, pin to pin routing and performance of the FPGA.

A 3-dimensional SRAM process integration reduces the cost of re-programnability for these interconnect structures. Similarly, any other 3-dimensional memory technology will offer the same cost advantage. Such a 3D technology may be programmable fuse links, where the programming is achieved by a laser gun. A method is also shown to map a programmable buffer to an application specific hard-wire buffer, wherein the wire delays are unaffected by the change. The conversion allows a further cost reduction to the user, thus providing an alternative. technique in designing an ASIC thru an original FPGA device.

Although an illustrative embodiment of the present invention, and various modifications thereof, have been described in detail herein with reference to the accompanying drawings, it is to be understood that the invention is not limited to this precise embodiment and the described modifications, and that various changes and further modifications may be effected therein by one skilled in the art without departing from the scope or spirit of the invention as defined in the appended claims.

What is claimed is:

1. A programmable interconnect structure in an integrated circuit comprising:
   a first wire and a second wire; and
   a buffer comprising an input and an output, said buffer receiving a weak signal at the input and providing a buffered signal at the output; and
   a user configurable configuration circuit comprising one or more memory elements; and
   a first programmable multiplexer comprising:
      two inputs and an output wherein the inputs are coupled to said first and second wires, and the output is coupled to said input of the buffer; and
      wherein, the data stored in the memory elements select one of said two wires to couple to said buffer input; and
   a second programmable multiplexer comprising:
      an input and two outputs, wherein the input is coupled to said output of the buffer and the outputs are coupled to said first and second wires; and
      wherein, the data stored in the memory elements select said buffer output to couple to one of said two wires;
   wherein, a signal received by the buffer on any one of the two wires is buffered and transmitted on the other wire; and wherein, said one or more memory elements in the configuration circuit are located substantially above the programmable multiplexers and the buffer.

2. The structure of claim 1, wherein said memory element in the configuration circuit comprises a random access memory (RAM) element or a read only memory (ROM) element.

3. The structure of claim 2, wherein said RAM element comprises a laser programmable fine element or a thin-film-transistor SRAM memory element.

4. The structure of claim 2, wherein said ROM element comprises a mask programmable metal optional link or a mask programmable via optional link.

5. The structure of claim 1, wherein said memory element is selected from one of a fuse link, an anti-fuse capacitor, an SRAM cell, a DRAM cell, a metal optional link, an EPROM cell, an EEPROM cell, a flash cell, a ferro electric element, an electro-chemical cell, an electro-magnetic cell, a carbon nano-tube, an optical element and a magnetic element.

6. The structure of claim 1, wherein said first and second programmable multiplexers comprises a programmable pass-gate, said pass-gate having a gate electrode coupled to a control signal generated by a memory bit in the configuration circuit.

7. The structure of claim 6, wherein said control signal generates a boosted voltage to the gate electrode of the pass-gate such that the pass-gate transmits the entire voltage level of the incoming signal.

8. A programmable interconnect structure in an integrated circuit comprising:
   three more wires; and
   a buffer comprising an input and an output, said buffer receiving a weak signal at the input and providing a buffered signal at the output; and
   a user configurable configuration circuit comprising a plurality of memory elements; and
   a first programmable multiplexer comprising:
      a plurality of inputs and an output, wherein the inputs are coupled to said three or more wires, and the output is coupled to said input of the buffer; and
      wherein, the data stored in the memory elements select one of said three or more wires to couple to said buffer input; and
   a second programmable multiplexer comprising:
      an input and a plurality of outputs, wherein the input is coupled to said output of the buffer and the outputs are coupled to said three or more wires; and
      wherein, the data stored in the memory elements select said buffer output to couple to one or more of said three or more wires;
   wherein, a signal received by the buffer on any one of the three or more wires is buffered and transmitted to one or more of the other wires.

9. The structure of claim 8, wherein said memory elements in the configuration circuits are located substantially above the programmable multiplexers and the buffer.

10. The structure of claim 9, wherein said memory elements comprises laser programmable Puce elements or thin-film-transistor SRAM memory elements.

11. The structure of claim 8, wherein said first programmable multiplexers further comprises:
   a plurality of first buffering stage inverters, each inverter having an input and an output; and
   a plurality of programmable pass-gates, each said pass-gate comprising:
      an input, and an output; and
      a gate electrode coupled to a control signal generated by a memory bit in the configuration circuit;
   wherein, the first buffering stage inputs form the inputs in the multiplexer, each of the outputs of the buffering stages is coupled to an input of said pass gates, and all of the outputs of the pass-gates arc coupled together to form the common node output of the multiplexer.

12. The structure of claim 8, wherein said first and second programmable multiplexers further comprises a plurality of programmable pass-gates, each said pass-gate having a gate electrode coupled to a control signal generated by a memory bit in the configuration circuit.

13. The structure of claim 12, wherein said first multiplexer pass-gates and said second multiplexer pass-gates are comprised of NMOS pass-gates located in a single active area geometry, said active area geometry further comprising:
   a single contact from each of said plurality of wires, each contact forming both the input to said first multiplexer and the output from said second multiplexer; and
   a series of contacts from said input of the huflex; said contacts coupled together to farm a common node and each said contact enclosed by NMOS pass-gates of said first multiplexer; and
   a series of contacts from said output of the buffer, said contacts coupled together to form a common node and each said contact enclosed by NMOS pass-gates of said second multiplexer.

14. The structure of claim 8, wherein said buffer further comprises a first buffering stage, zero or more intermediate buffering stages, and a last buffering stage, wherein:
   each buffering stage is an inverter comprising an input and an output; and
   the input of the first stage being the input to the buffer; and
   the output of the last stage being the output of the buffer; and
   the input of an intermediate stage coupled to the output of the previous stage, and the output of said intermediate stage coupled to the input of the next stage.

15. A programmable interconnect device in an integrated circuit comprising:
   a plurality of bundles of wires, each bundle comprising a plurality of parallel wires; and
   a plurality of sets of wires, each said set formed by selecting one or more wires from either all of said bundles of wires or from some of said bundles of wires; and
   a user configurable configuration circuit comprising a plurality of memory elements; and
   a plurality of programmable interconnect structures, each said structure further comprising:
      a plurality of wires from a said set of wires; and
      a buffer comprising an input and an output, said buffer receiving a weak signal at the input and providing a buffered signal at the output; and
      a first programmable multiplexer comprising:
         a plurality of inputs and an output, wherein the inputs are coupled to said plurality of wires, and the output is coupled to said input of the buffer; and
         wherein, the data stored in the memory elements select one of said plurality of wires to couple to said buffer input; and
      a second programmable multiplexer comprising:
         an input and a plurality of outputs, wherein the input is coupled to said output of the buffering the outputs are coupled to said plurality of wires; and wherein, the data stored in the memory elements select said buffer output to couple to one or more of said plurality of wires; and wherein each of said structures further routes a buffered signal within the plurality of wires of said set of wires.

16. The device of claim 15, wherein the memory elements in the configuration circuits are located substantially above the bundles of wires.

17. The device of claim 15, wherein, the memory elements in the configuration circuits are located substantially above the programmable multiplexers and the buffers.

18. The device of claim 15, wherein each bundle has an equal number of wires comprising a numbering sequence starting at one and ending at N, where N is an integer, and each said set of wires comprises the same number of M wires, where M is an integer between zero and N.

19. The device of claim 18, wherein a first bundle of wires has the same exact wires as a second bundle of wires, but wherein said numbering sequence of the first bundle is offset from the second bundle by an integer value M, where M is greater than one but less than N.

* * * * *